US012620163B2

(12) United States Patent
Cai et al.

(10) Patent No.: US 12,620,163 B2
(45) Date of Patent: May 5, 2026

(54) HIGH-FIDELITY MICRO-DOPPLER EFFECT SIMULATOR

(71) Applicant: Aptiv Technologies AG, Schaffhausen (CH)

(72) Inventors: Xiuzhang Cai, Carmel, IN (US); Bruno F. Camps Raga, Mt. Juliet, TN (US); James Searcy, Westfield, IN (US)

(73) Assignee: Aptiv Technologies AG, Schaffhausen (CH)

(*) Notice: Subject to any disclaimer, the term of this patent is extended or adjusted under 35 U.S.C. 154(b) by 142 days.

(21) Appl. No.: 18/408,181

(22) Filed: Jan. 9, 2024

(65) Prior Publication Data

US 2025/0225712 A1 Jul. 10, 2025

(51) Int. Cl.
| | |
|---|---|
| *G06T 15/06* | (2011.01) |
| *G06T 7/20* | (2017.01) |
| *G06T 15/50* | (2011.01) |
| *G06T 17/20* | (2006.01) |
| *G06F 30/12* | (2020.01) |

(52) U.S. Cl.
CPC ............... G06T 15/06 (2013.01); G06T 7/20 (2013.01); G06T 15/506 (2013.01); G06T 17/205 (2013.01); *G06F 30/12* (2020.01); *G06T 2207/10028* (2013.01);
(Continued)

(58) Field of Classification Search
CPC ......... G06T 15/06; G06T 7/20; G06T 15/506; G06T 17/205; G06T 2207/10028; G06T 2207/30184; G06T 2207/30188; G06T 2207/30196; G06F 30/12; G06F 2111/10; G06F 2111/20; G06F 2119/02; G06F 30/20; G01S 7/4052; G01S 7/41; G01S 7/415;
(Continued)

(56) References Cited

U.S. PATENT DOCUMENTS 10,782,122 B2 * 9/2020 Ishigaki .............. G01B 11/2441
11,301,603 B2 4/2022 Camps Raga et al.
(Continued)

OTHER PUBLICATIONS

Extended European Search Report for EP24206331.1 dated Mar. 19, 2025, 10 pages.
(Continued)

*Primary Examiner* — Said Broome
(74) *Attorney, Agent, or Firm* — Miller Johnson

(57) ABSTRACT

A computer-implemented method includes receiving environment description data associated with a simulated environment including an object and identifying an object type of the object. The method includes, in response to the object type being a human, identifying a motion type associated with the object, loading a CAD model associated with the object, loading a motion file associated with the motion type, and mapping the CAD model to the motion file. The method includes performing ray tracing simulation, performing physical optics simulation, calculating at least one of a Doppler shift and a micro-Doppler shift for each ray of a set of rays, performing ray clustering, and transforming a simulation output for display on a user device. The simulation output includes a motion simulation associated with the motion type of the object. The motion simulation includes a main motion of the object and a set of micro-motions of the object.

20 Claims, 24 Drawing Sheets

(52) U.S. Cl.
CPC .............. *G06T 2207/30184* (2013.01); *G06T 2207/30188* (2013.01); *G06T 2207/30196* (2013.01)

(58) Field of Classification Search
CPC ......... G01S 13/04; G01S 13/50; G01S 13/66; G01S 13/89; G01S 13/931
See application file for complete search history.

(56) References Cited

U.S. PATENT DOCUMENTS

| | | | |
|---|---|---|---|
| 2019/0381736 A1* | 12/2019 | Jensen | ............... G01B 11/2518 |
| 2021/0192762 A1* | 6/2021 | Guan | ....................... G06T 15/06 |
| 2023/0004142 A1* | 1/2023 | Cetinkaya | .......... G05B 19/4099 |
| 2023/0099845 A1 | 3/2023 | Cai | |

OTHER PUBLICATIONS

Victor Chen, "The Micro-Doppler Effect in Radar: Phenomenon, Model, and Simulation Study," Second Edition, Artech, 2019, 21 pages.

Ishak et al., "Advanced Radar Micro-Doppler Simulation Environment for Human Motion Applications," In 2019 IEEE Radar Conference (RadarConf), pp. 1-6. IEEE, 2019.

Vahidpour et al., "Millimeter-Wave Doppler Spectrum and Polarimetric Response of Walking Bodies," IEEE Trans. Geosc. Remote Sensing, vol. 50, No. 7, pp. 2866-2879, Jul. 2012.

Chipengo et al., "High Fidelity Physics Simulation-Based Convolutional Neural Network for Automotive Radar Target Classification Using Micro-Doppler," IEEE Access 9, 2021, pp. 82597-82617.

* cited by examiner

HIGH-FIDELITY MICRO-DOPPLER EFFECT SIMULATOR

FIELD

The present disclosure relates to electromagnetic simulation and more particularly to simulation of electromagnetic environments for radars in wheeled vehicles.

BACKGROUND

Radars are useful devices that can detect and track objects. In comparison to other types of sensors, for example cameras, radars provide improved performance in difficult environmental conditions, such as low lighting, fog, and/or with moving or overlapping objects. Accordingly, radars provide many advantages for driver assistance applications and/or autonomous driving applications, among others.

While designing and developing a radar, engineers may perform live tests (for example, real-time tests) to evaluate performance of the radar. Live tests can be expensive and time-intensive, and typically occur after design and implementation of a radar. As such, there can be a lot of rework and additional cost associated with addressing problems revealed by a live test. Accordingly, radar simulation via a radar simulator may be performed instead of live tests to evaluate performance of a radar. Radar simulation may facilitate discovery of problems sooner in the development of a radar and may be faster and less expensive in comparison with live tests.

SUMMARY

A computer-implemented method includes receiving environment description data associated with a simulated environment including an object and identifying an object type of the object. The method includes, in response to the object type being a human object type, identifying a motion type associated with the object, loading a CAD model associated with the object, loading a motion file associated with the motion type, and mapping the CAD model to the motion file. The method includes performing ray tracing simulation including launching a set of rays from a ray source towards the object and determining a set of propagation paths of the set of rays from the ray source to the object and a set of reflection paths of the set of rays from the object to a ray receiver. The method includes performing physical optics simulation to determine a set of scattered fields associated with the set of reflection paths of the set of rays, calculating at least one of a Doppler shift and a micro-Doppler shift for each ray of the set of rays, performing ray clustering including combining rays of the set of rays that include one or more similar characteristics, and transforming a simulation output for display on a user device. The simulation output includes a motion simulation associated with the motion type of the object, and the motion simulation includes a main motion of the object and a set of micro-motions of the object.

In other features, the object type is at least one of a human object type, a building object type, a vehicle object type, an animal object type, and a tree object type. In other features, the motion type is associated with a physical activity of the object. The physical activity is associated with one of walking, running, dancing, jumping, and riding a bicycle. In other features, loading the CAD model associated with the object includes selecting the CAD model from a CAD model database. In other features, loading the motion file associated with the motion type includes selecting the motion file from a motion file database.

In other features, identifying the motion type associated with the object includes determining a speed of the object. In response to the speed being greater than a determined threshold, selecting a running motion type as the motion type. In response to the speed being less than the determined threshold, selecting a walking motion type as the motion type. In other features, the method includes modifying a mesh of the object, calculating a speed of each facet of the object, generating an acceleration data structure, and copying the acceleration data structure to a graphics processing unit in connection with performing the ray tracing simulation.

In other features, the ray source and the ray receiver are associated with a reference point. The reference point is based on a radar system of a vehicle. In other features, mapping the CAD model to the motion file includes linking vertices of a mesh of the object to a first set of bones of the CAD model, mapping a second set of bones of the motion file to the first set of bones, initializing a transforming matrix, and identifying a period of one in cycle in time and distance of the motion file.

In other features, the method includes, in response to the ray receiver receiving a ray of the set of rays that hit the object, querying an object tree data structure to identify the object type of the object. In other features, in response to the object type being the human object type, the ray tracing simulation is performed in connection with a global coordinate system. In response to the object type not being the human object type, the ray tracing simulation is performed in connection with a local coordinate system.

A computer system includes memory hardware configured to store computer-executable instructions and processor hardware configured to execute the instructions. The instructions include receiving environment description data associated with a simulated environment including an object and identifying an object type of the object. The instructions include, in response to the object type being a human object type, identifying a motion type associated with the object, loading a CAD model associated with the object, loading a motion file associated with the motion type, and mapping the CAD model to the motion file. The instructions include performing ray tracing simulation including launching a set of rays from a ray source towards the object, determining a set of propagation paths of the set of rays from the ray source to the object and a set of reflection paths of the set of rays from the object to a ray receiver, performing physical optics simulation to determine a set of scattered fields associated with the set of reflection paths of the set of rays, calculating at least one of a Doppler shift and a micro-Doppler shift for each ray of the set of rays, performing ray clustering including combining rays of the set of rays that include one or more similar characteristics, and transforming a simulation output for display on a user device. The simulation output includes a motion simulation associated with the motion type of the object, and the motion simulation includes a main motion of the object and a set of micro-motions of the object.

In other features, the object type is at least one of a human object type, a building object type, a vehicle object type, an animal object type, and a tree object type. In other features, the motion type is associated with a physical activity of the object. The physical activity is associated with one of walking, running, dancing, jumping, and riding a bicycle. In other features, loading the CAD model associated with the object includes selecting the CAD model from a CAD model database. In other features, loading the motion file associated with the motion type includes selecting the motion file from a motion file database.

In other features, identifying the motion type associated with the object includes determining a speed of the object. In response to the speed being greater than a determined threshold, selecting a running motion type as the motion type. In response to the speed being less than the determined threshold, selecting a walking motion type as the motion type. In other features, the instructions further include modifying a mesh of the object, calculating a speed of each facet of the object, generating an acceleration data structure, and copying the acceleration data structure to a graphics processing unit in connection with performing the ray tracing simulation.

In other features, the ray source and the ray receiver are associated with a reference point. The reference point is based on a radar system of a vehicle. In other features, mapping the CAD model to the motion file includes linking vertices of a mesh of the object to a first set of bones of the CAD model, mapping a second set of bones of the motion file to the first set of bones, initializing a transforming matrix, and identifying a period of one in cycle in time and distance of the motion file.

In other features, the instructions further include, in response to the ray receiver receiving a ray of the set of rays that hit the object, querying an object tree data structure to identify the object type of the object. In other features, in response to the object type being the human object type, the ray tracing simulation is performed in connection with a global coordinate system. In response to the object type not being the human object type, the ray tracing simulation is performed in connection with a local coordinate system.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

4

Figure 8:
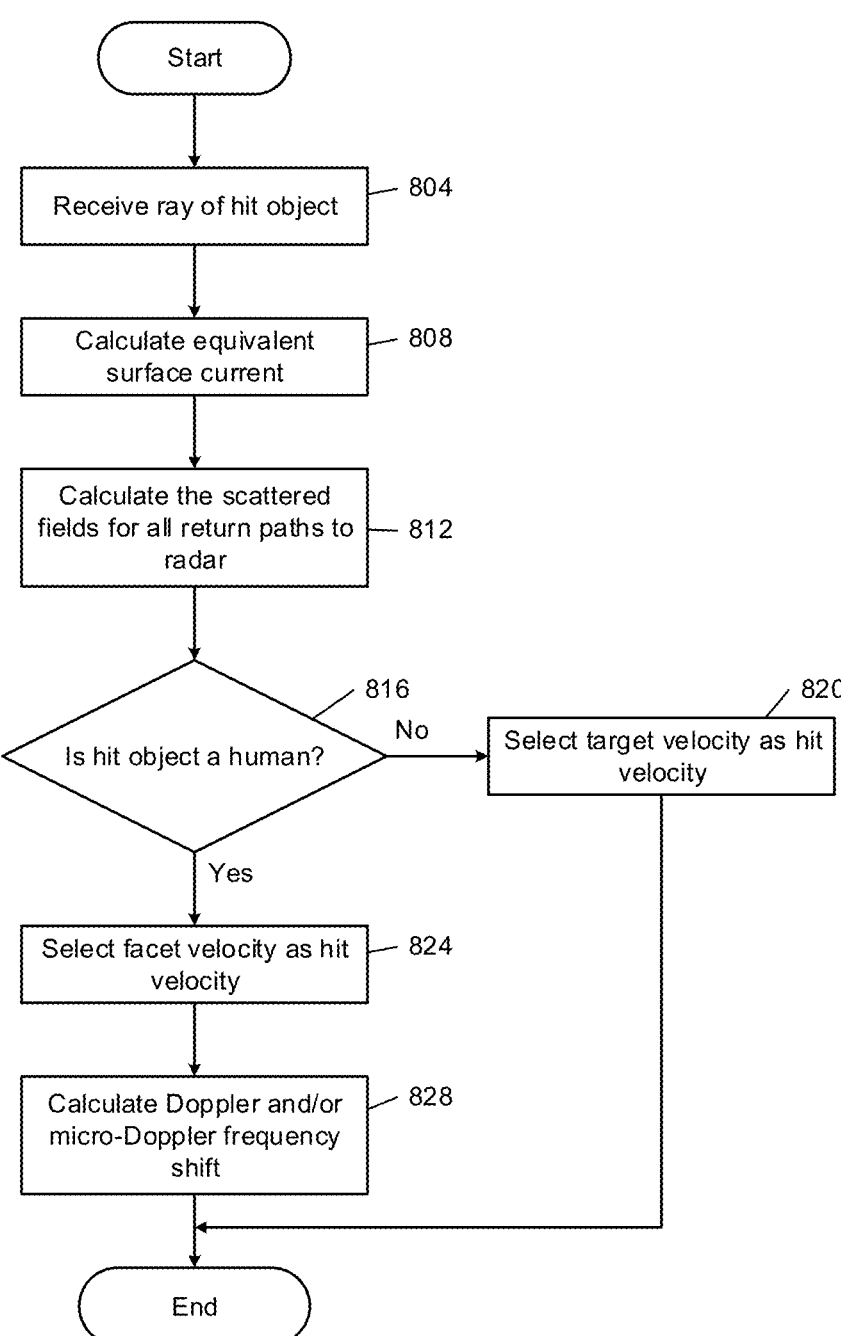

FIG. 8 is a flowchart depicting an example process of calculating scattered fields and micro-Doppler frequency shift of an electromagnetic ray according to the principles of the present disclosure.

Figure 9A:
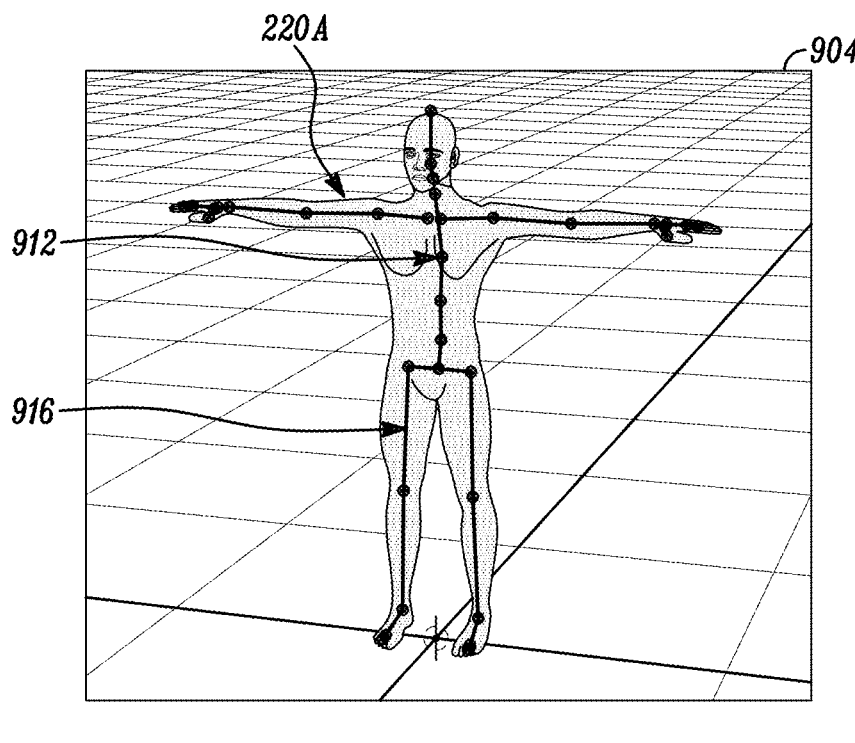

FIG. 9A is a graphical representation of an example CAD model associated with an object according to the principles of the present disclosure.

Figure 9B:
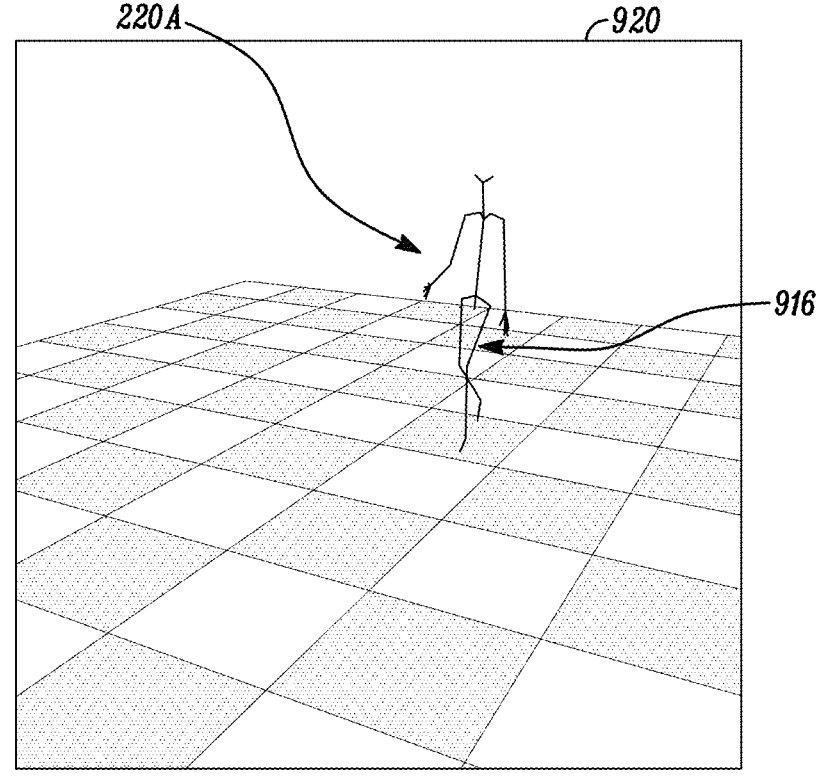

FIG. 9B is a graphical representation of an example motion file associated with an object according to the principles of the present disclosure.

Figure 10:
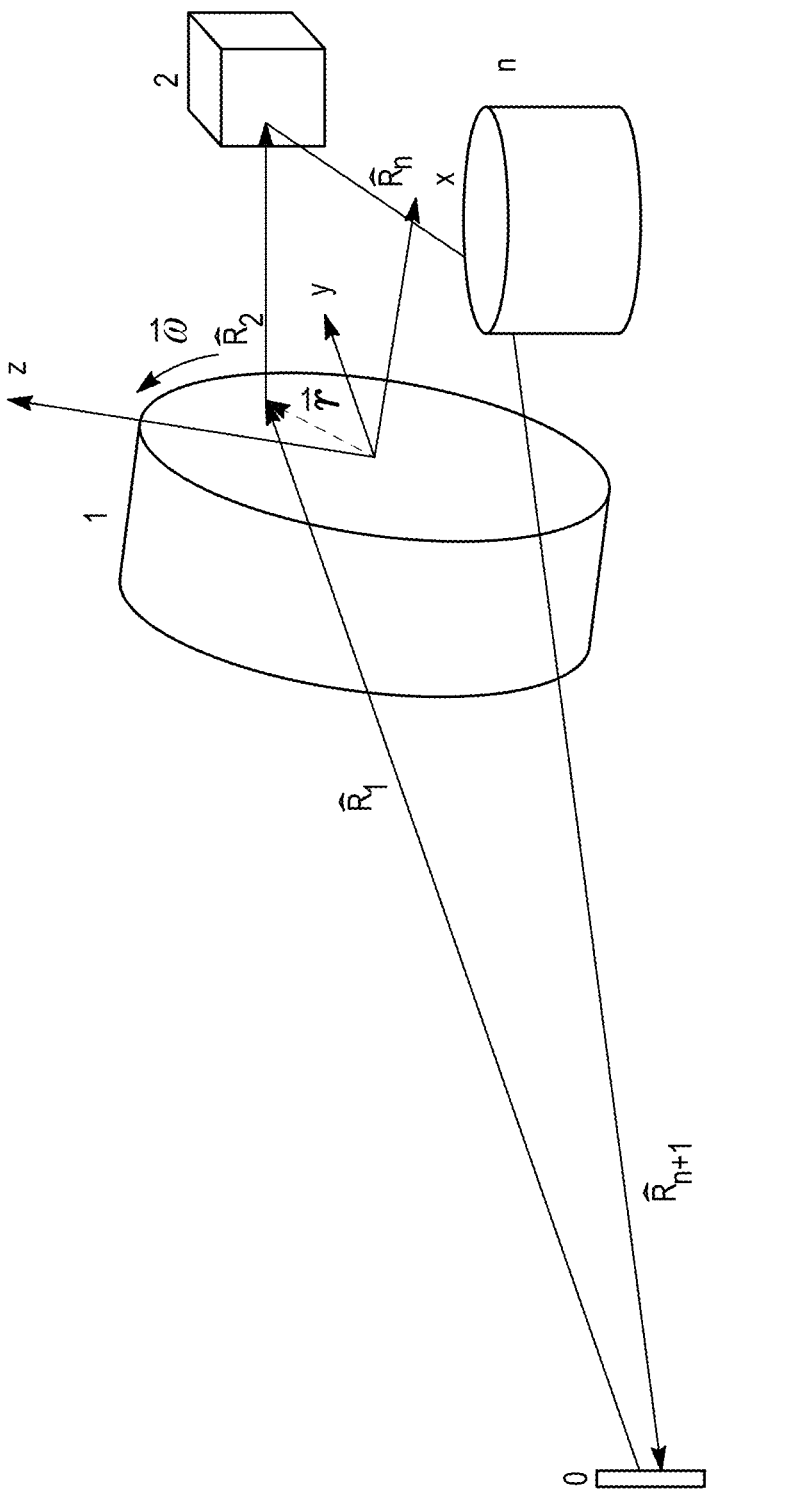

FIG. 10 is a graphical representation of an example Doppler frequency shift accumulation along a path of a ray according to the principles of the present disclosure.

Figure 11B:
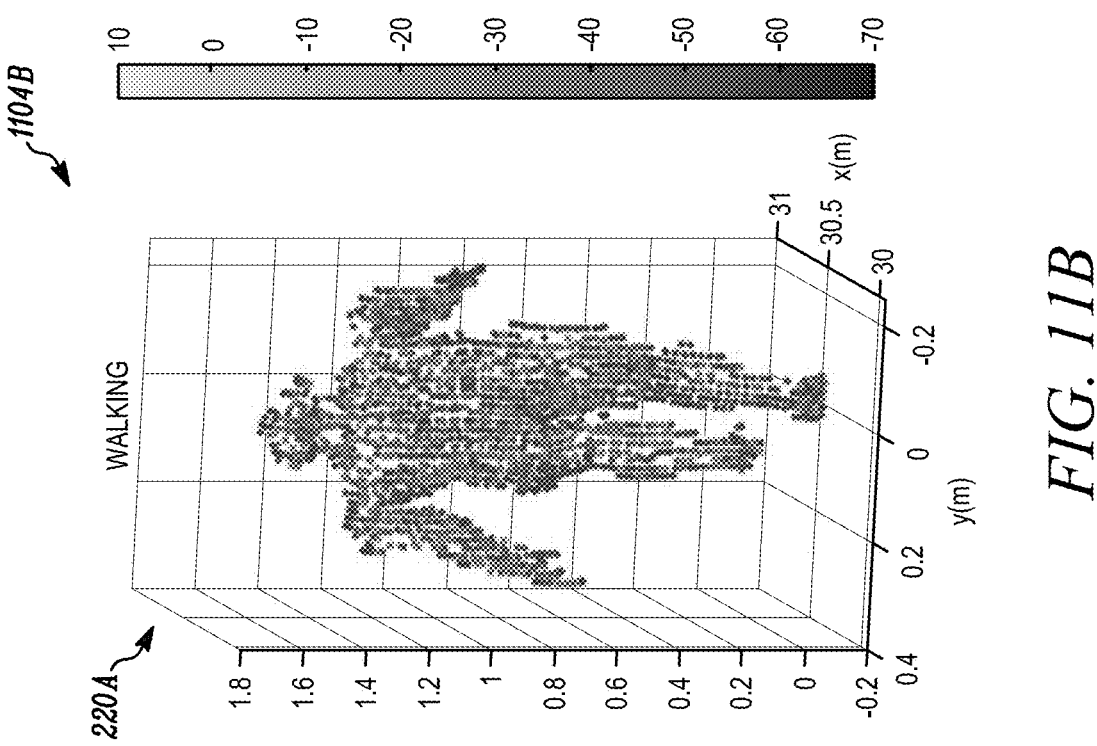
Figure 11A:
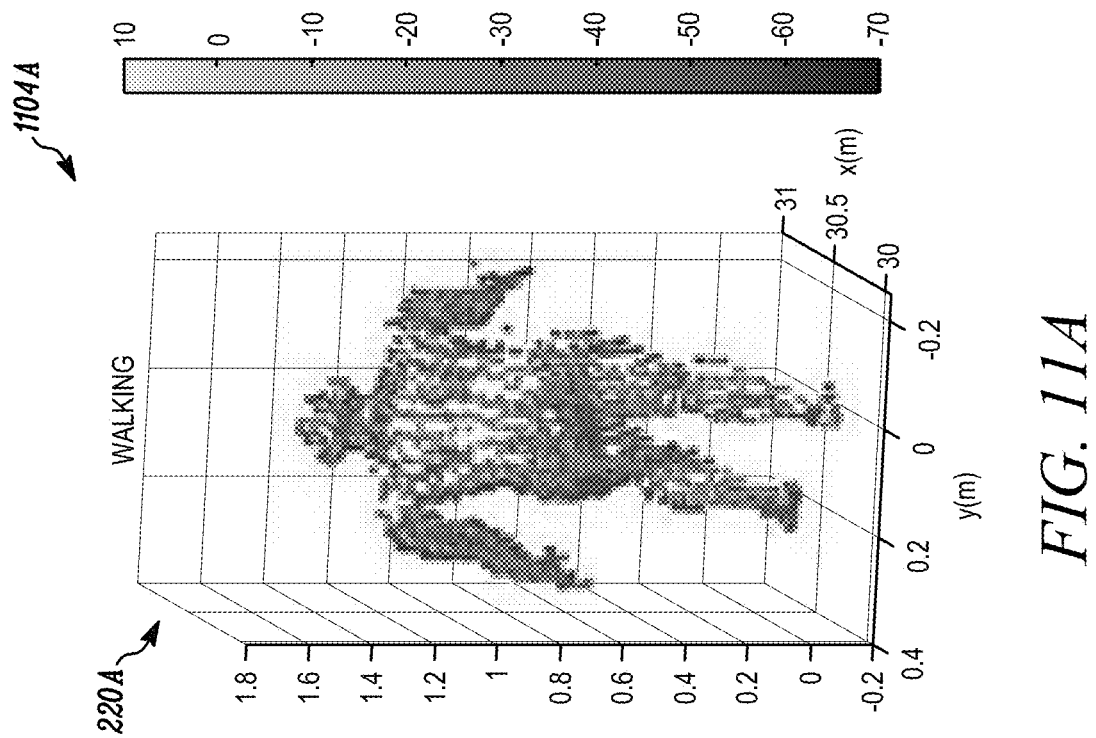
Figure 11D:
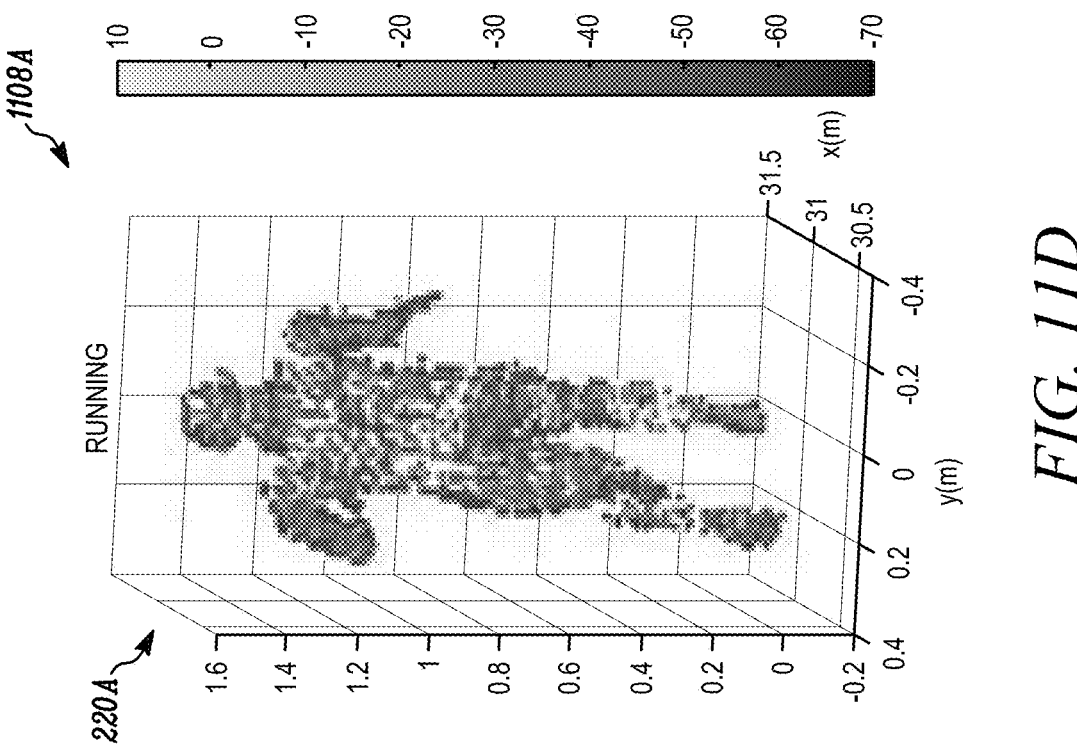
Figure 11C:
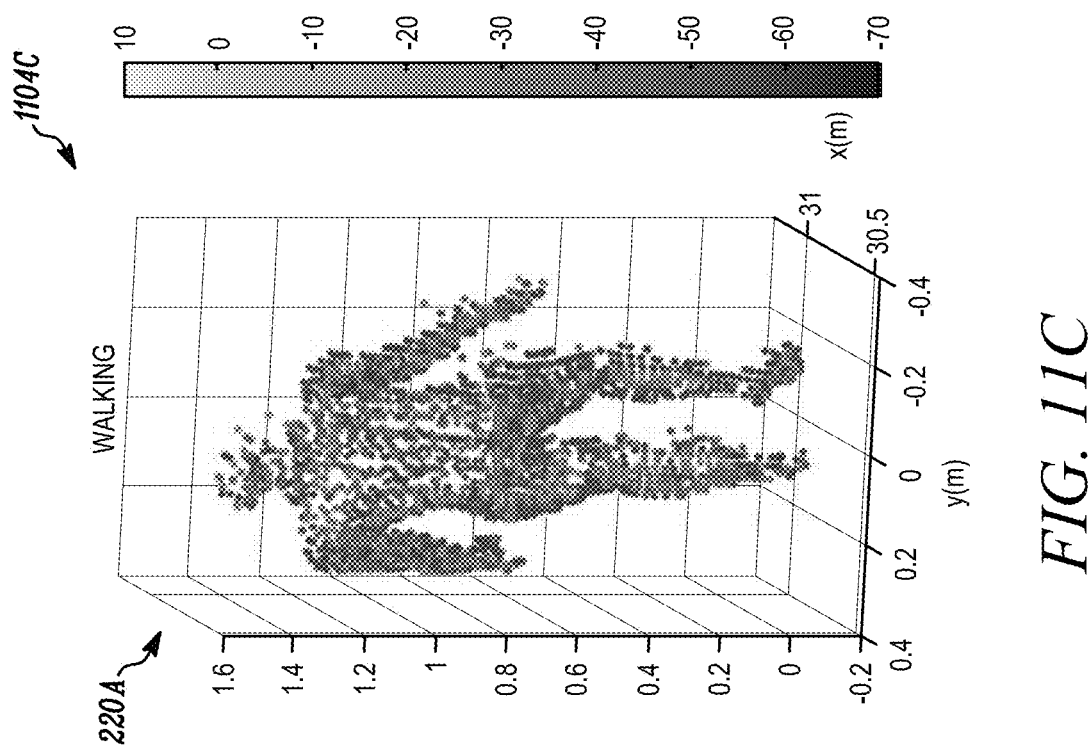
Figure 11F:
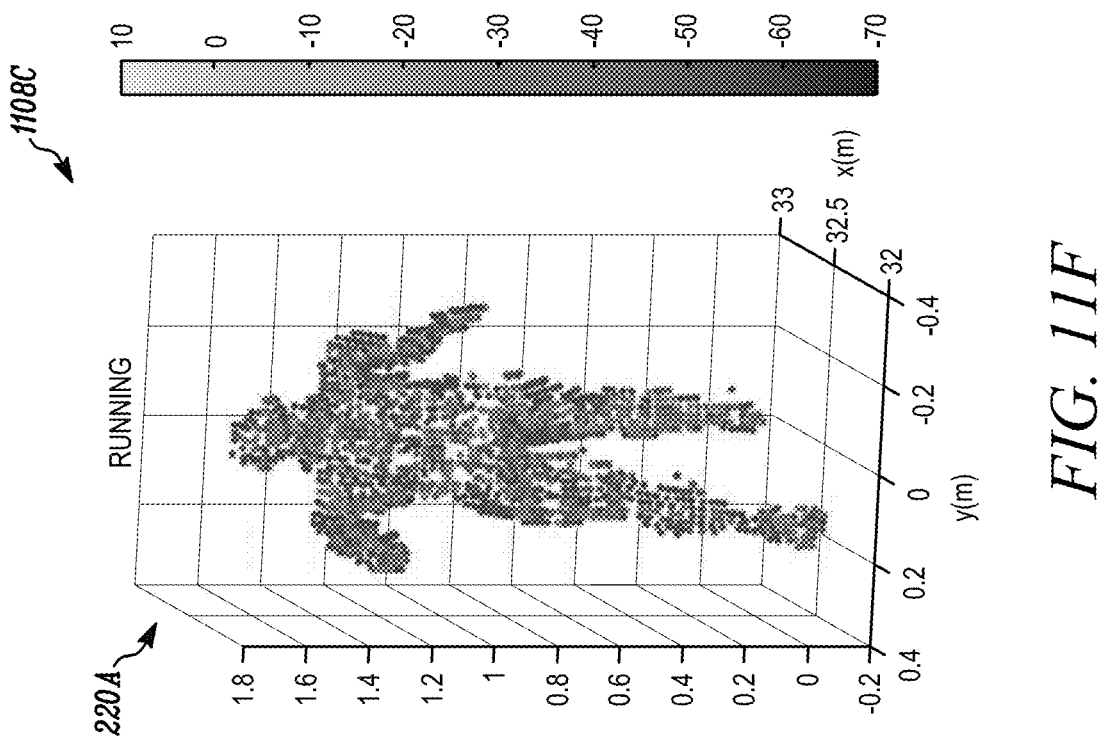
Figure 11E:
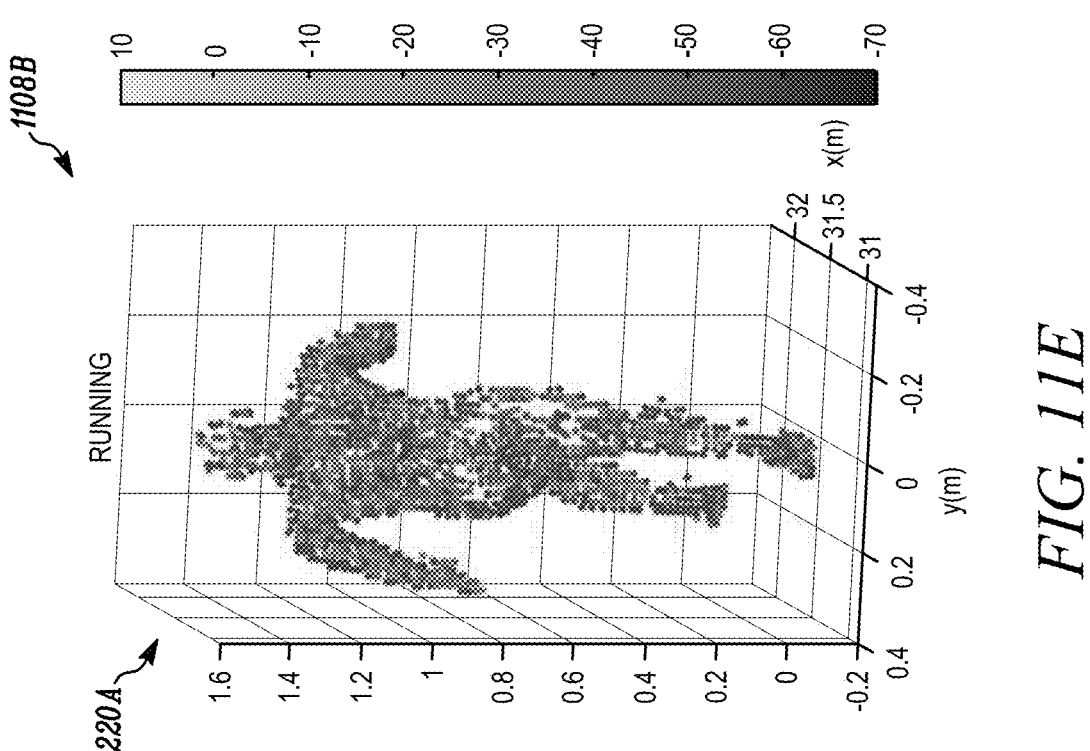
Figure 11H:
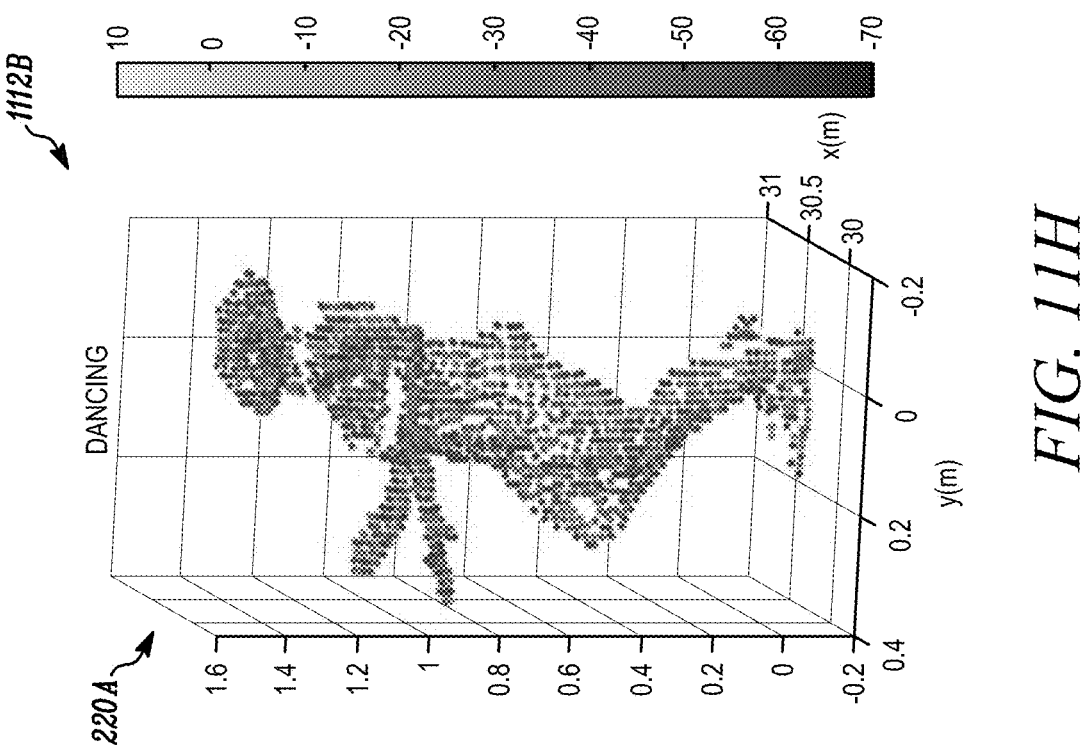
Figure 11G:
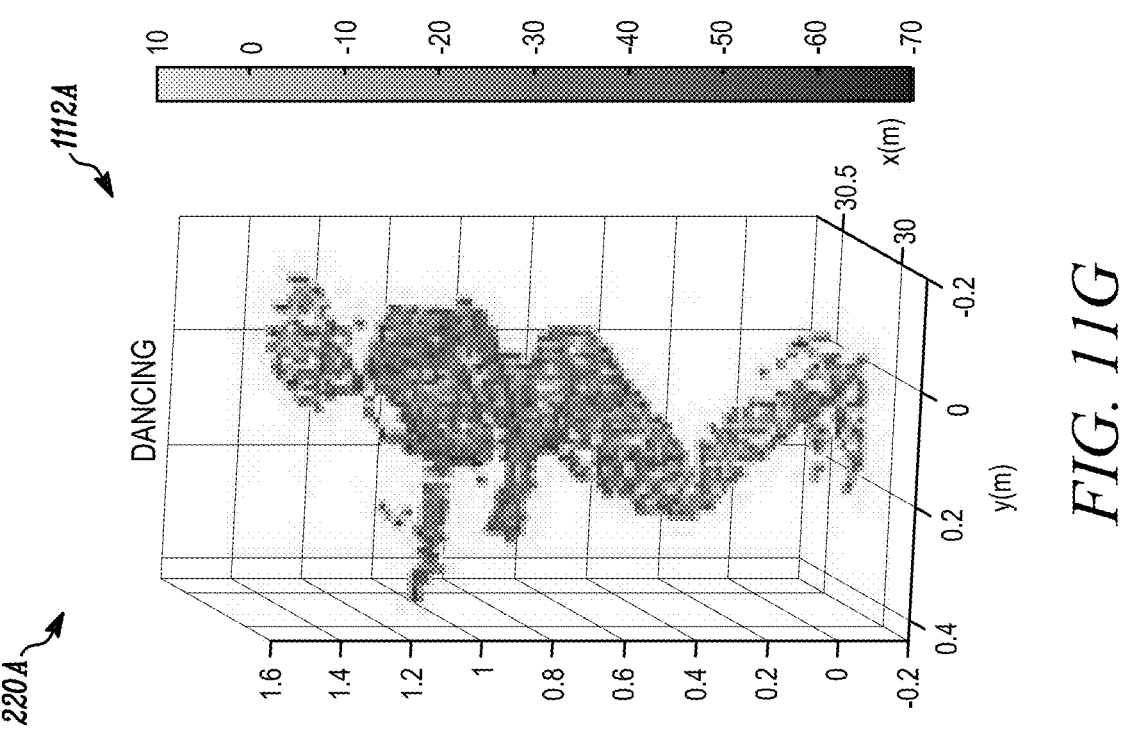
Figures 11I, 11J:
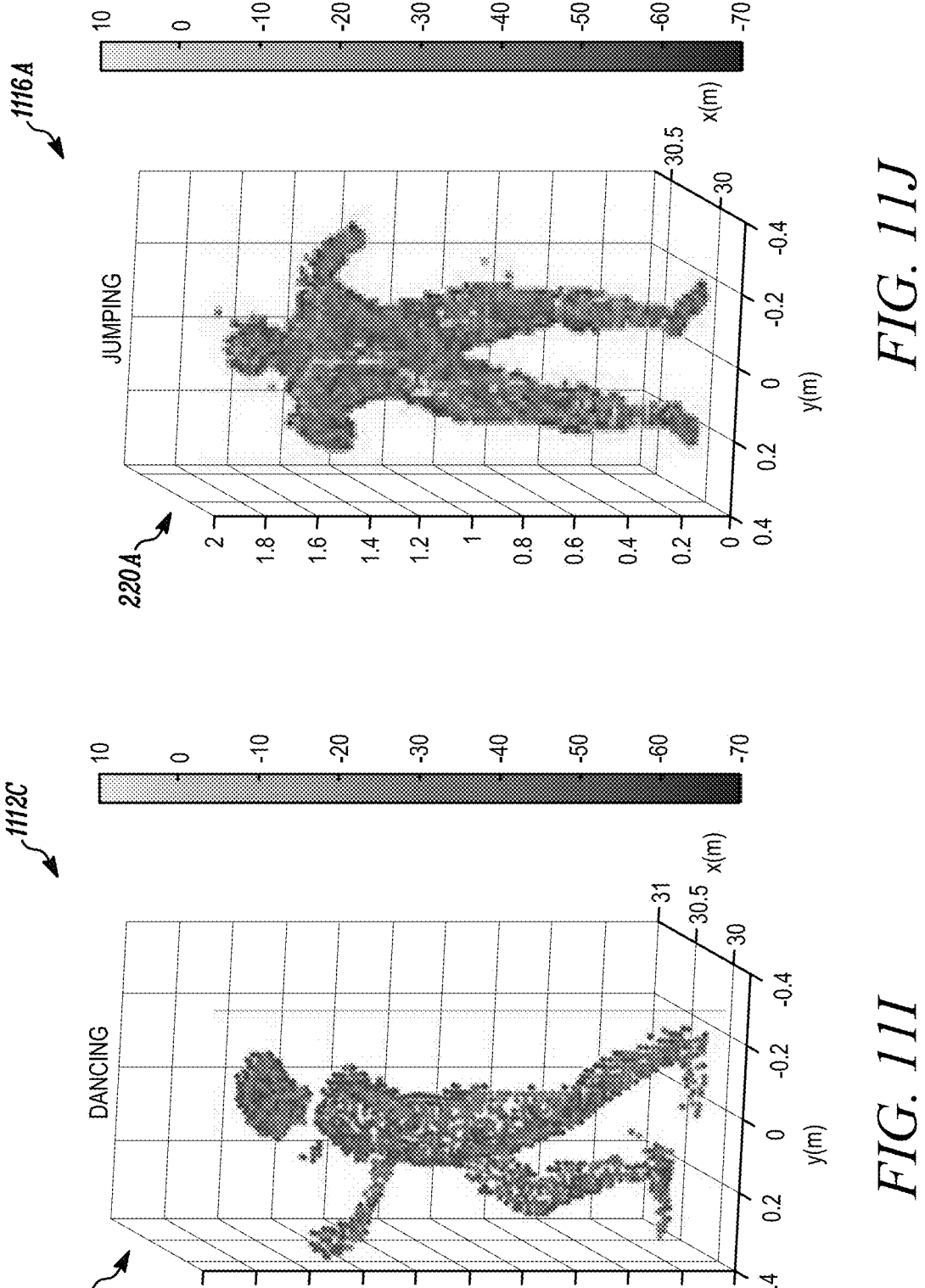
Figures 11K, 11L:
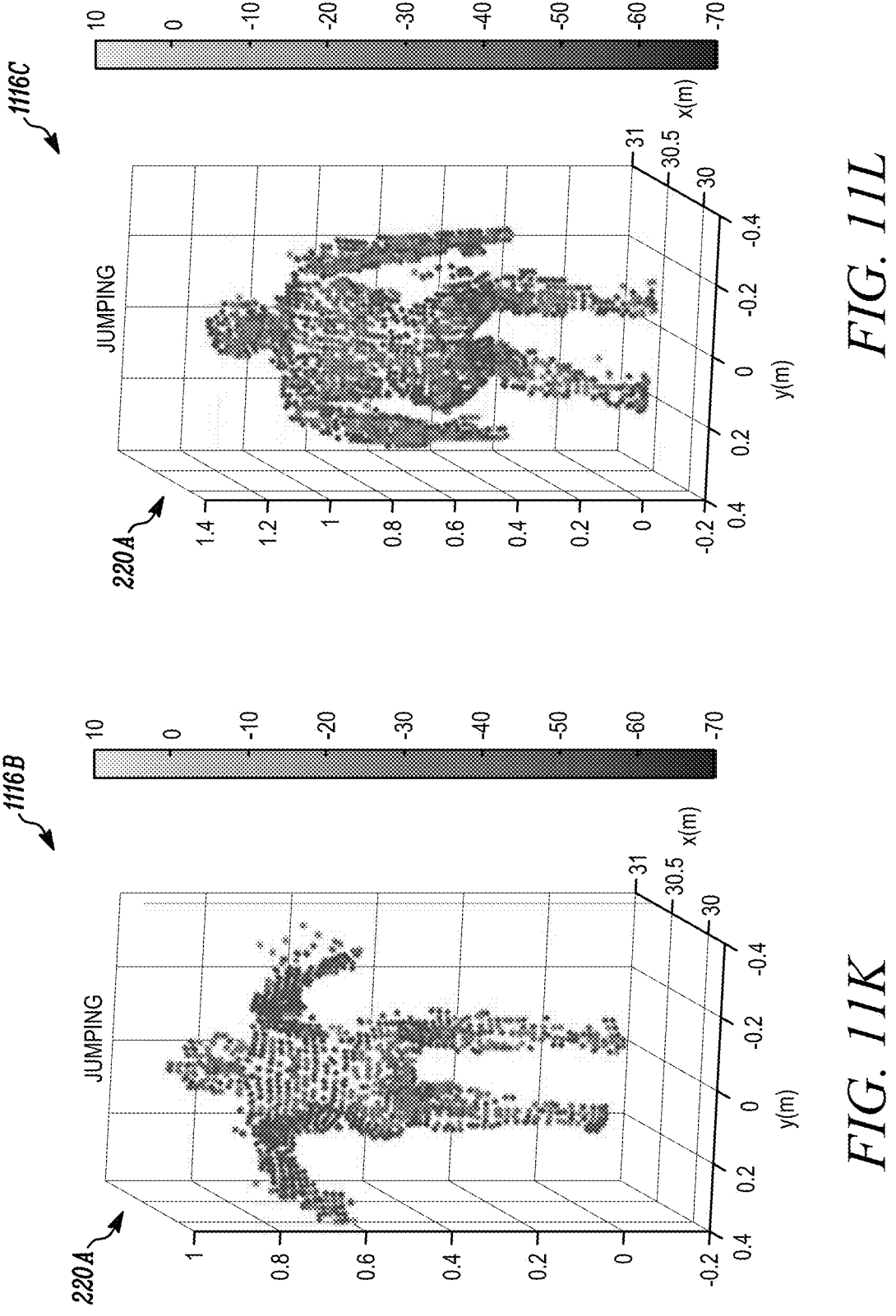
Figure 11N:
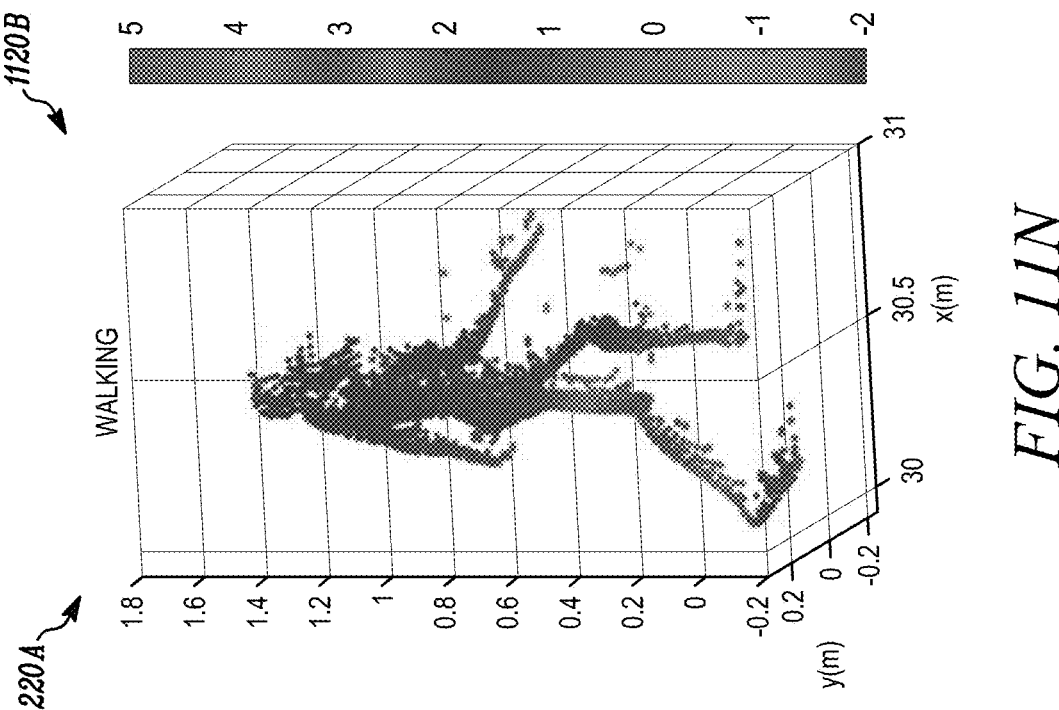
Figure 11M:
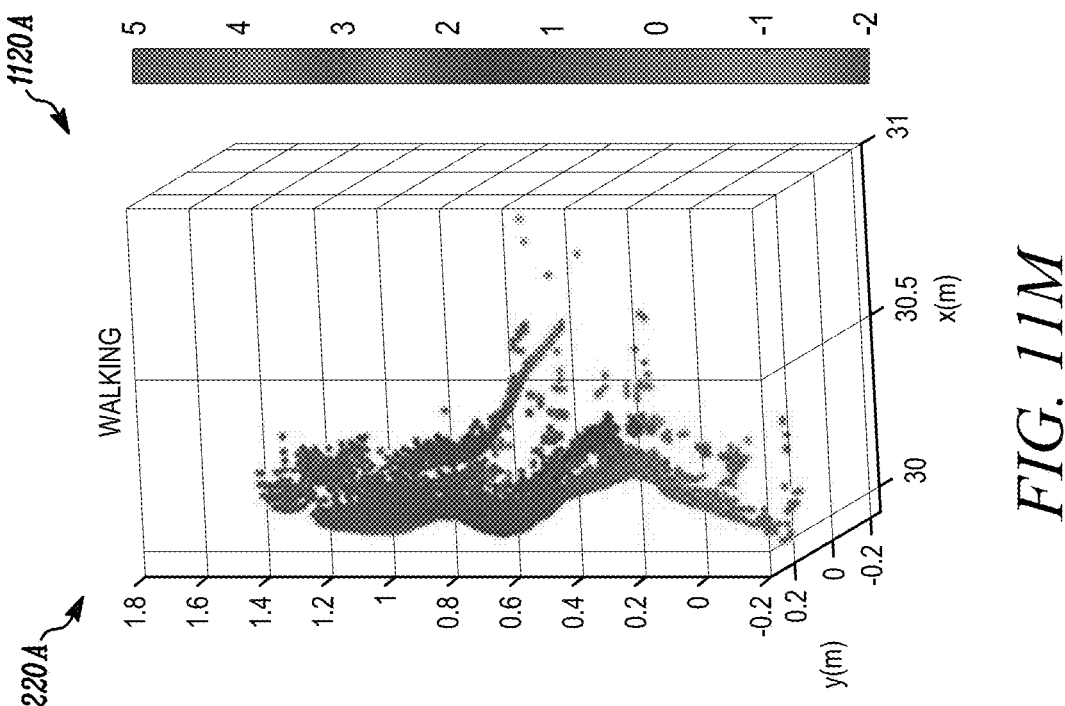
Figure 11P:
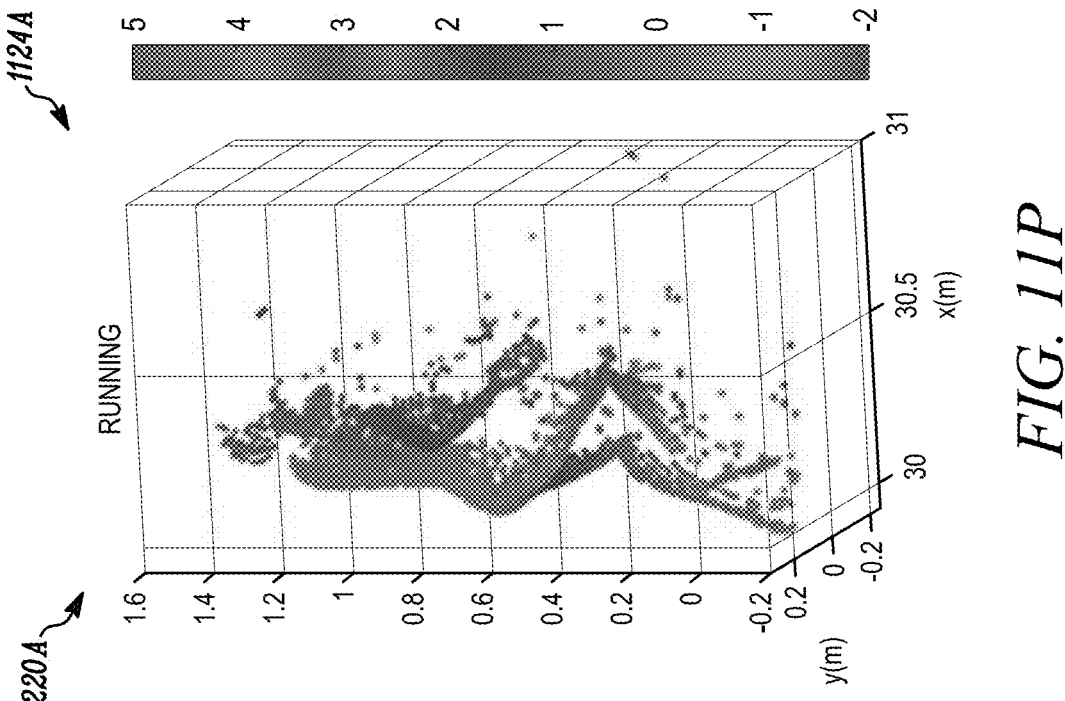
Figure 11O:
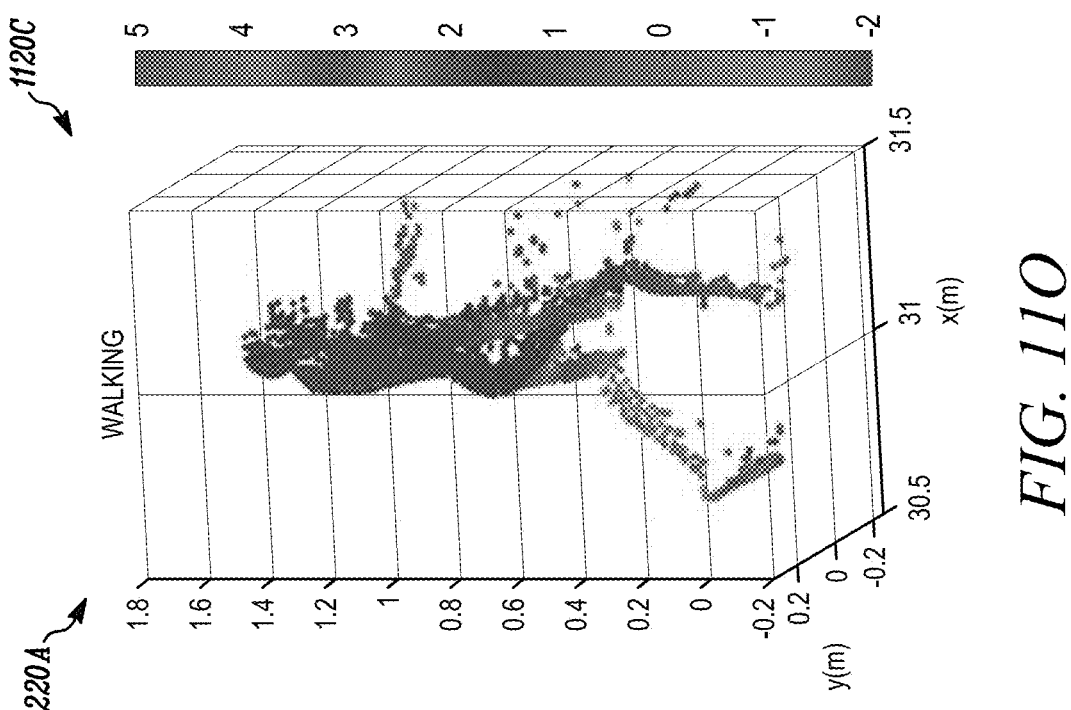
Figure 11R:
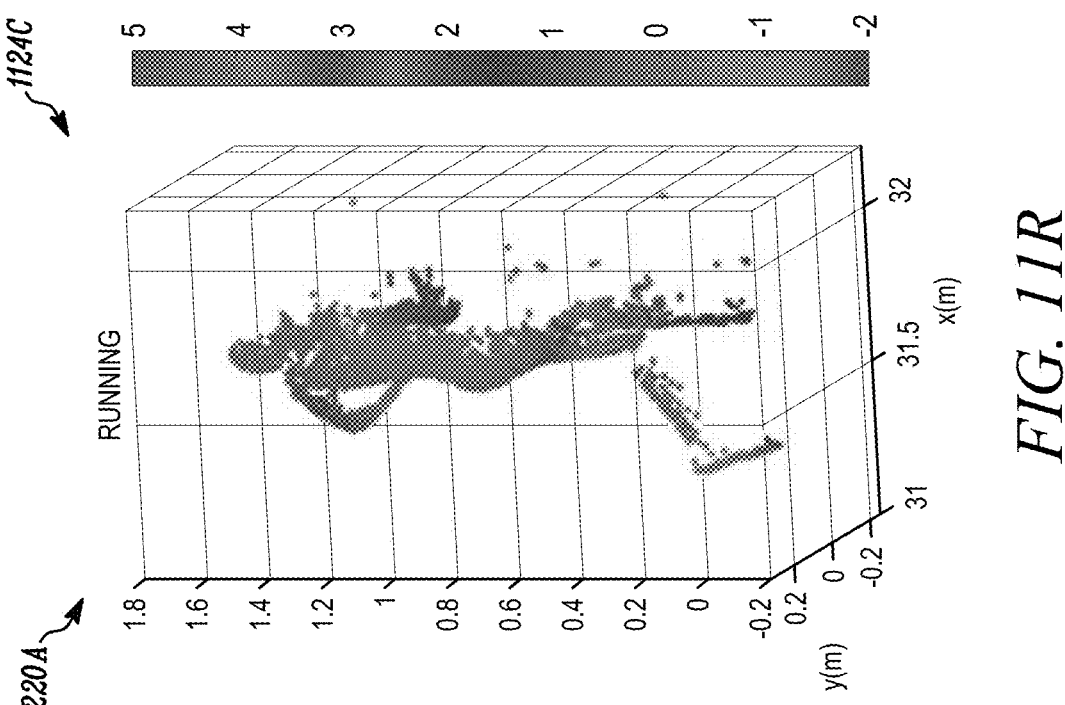
Figure 11Q:
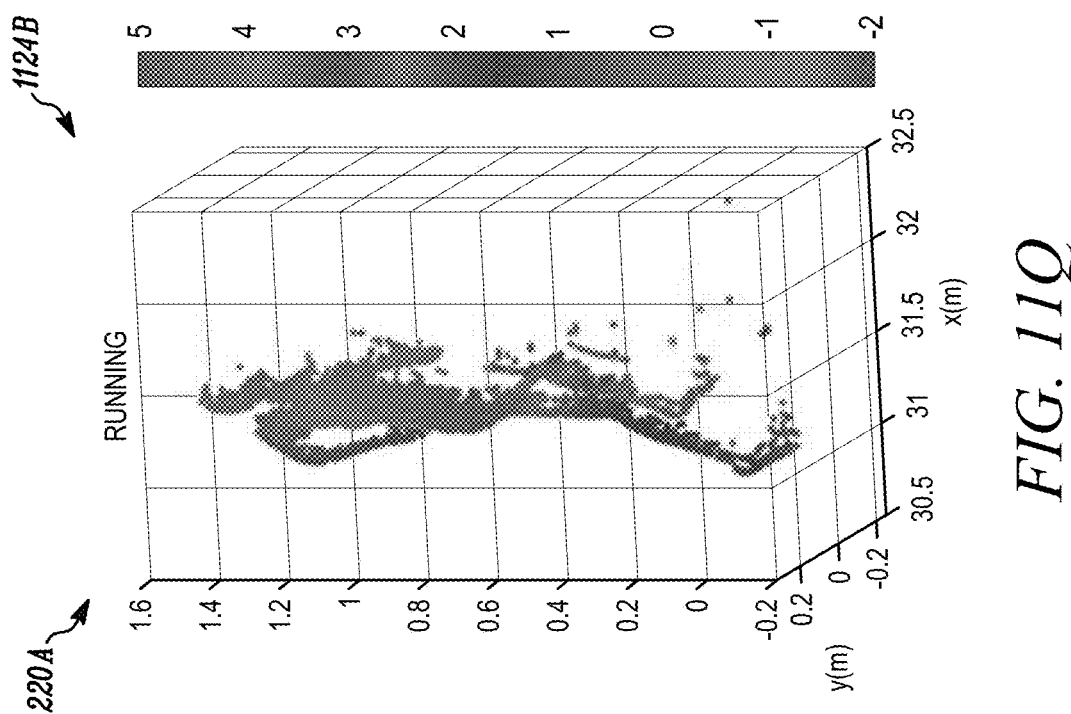
Figure 11T:
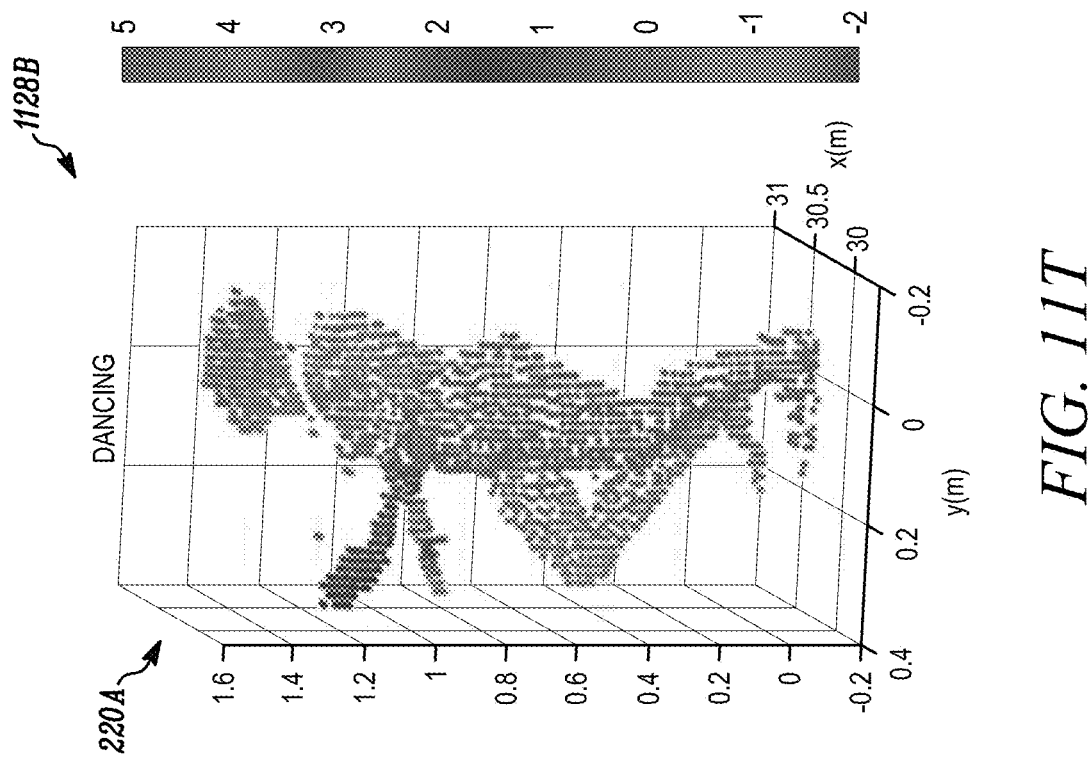
Figure 11S:
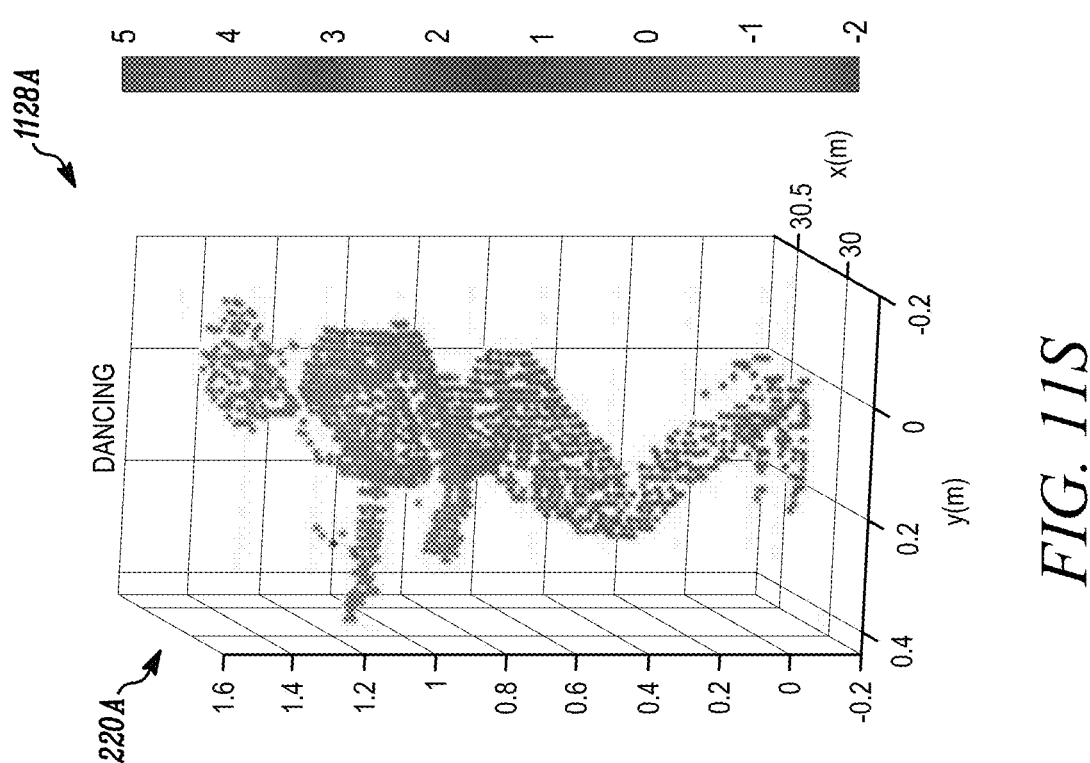
Figure 11V:
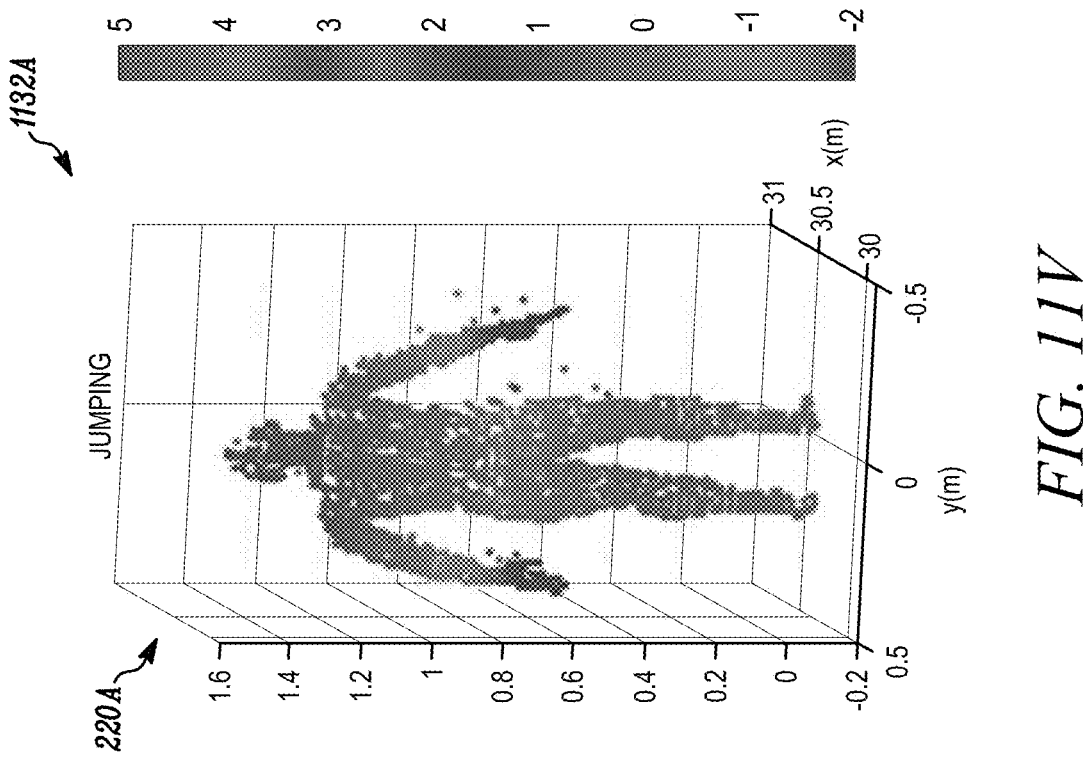
Figure 11U:
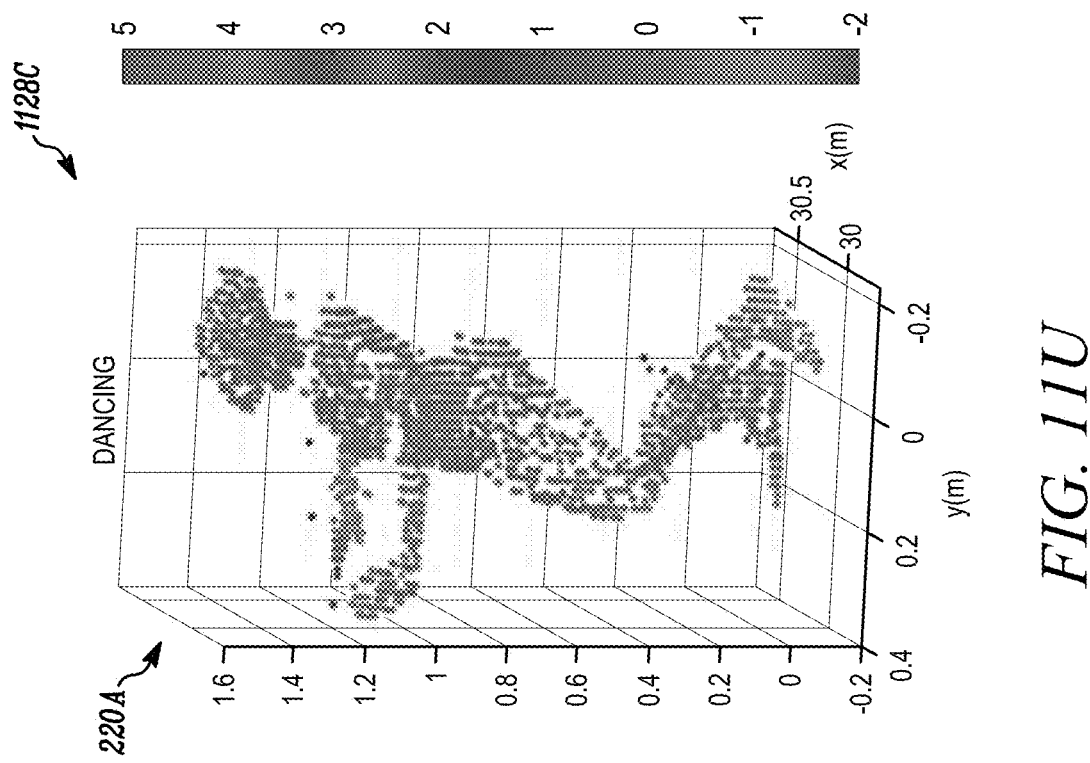
Figure 11X:
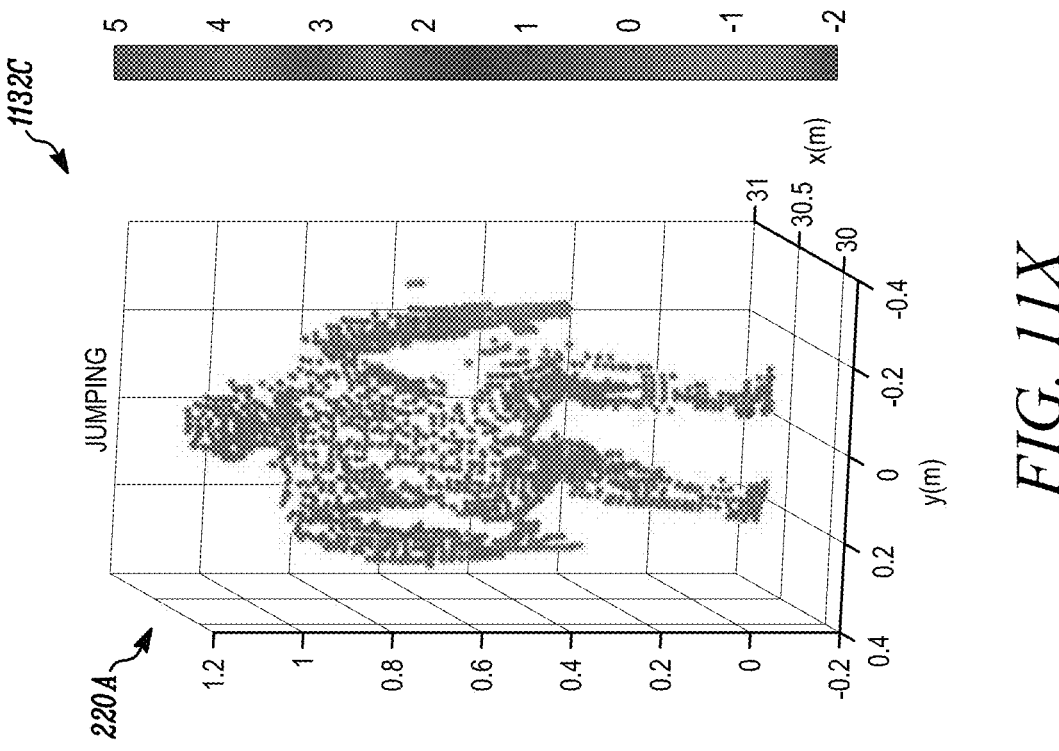

FIGS. 11A-11X are graphical representations of example outputs generated by an output generation module according to the principles of the present disclosure.

Figure 12A:
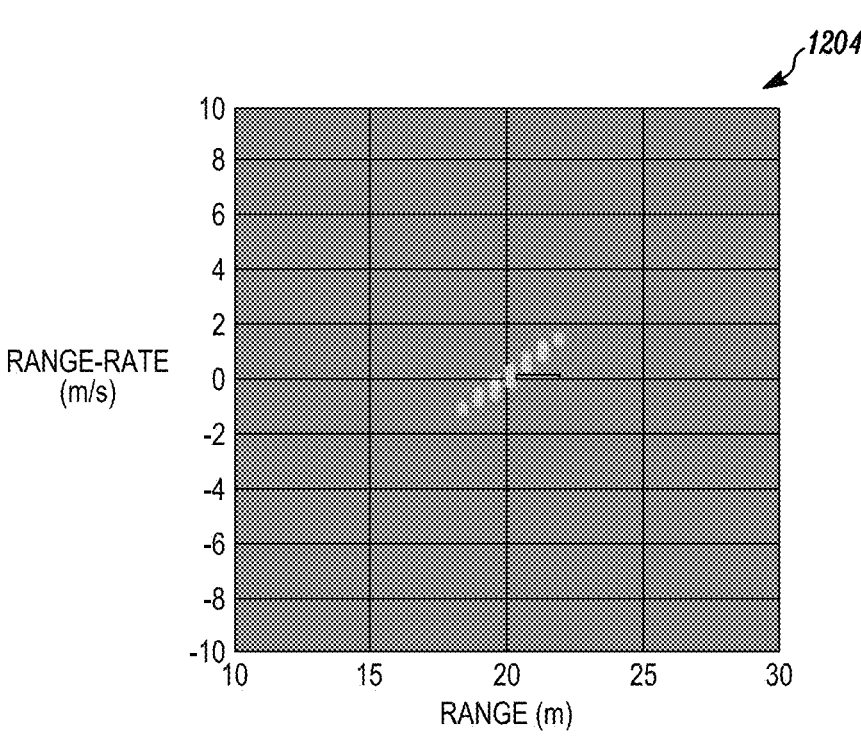
Figure 12B:
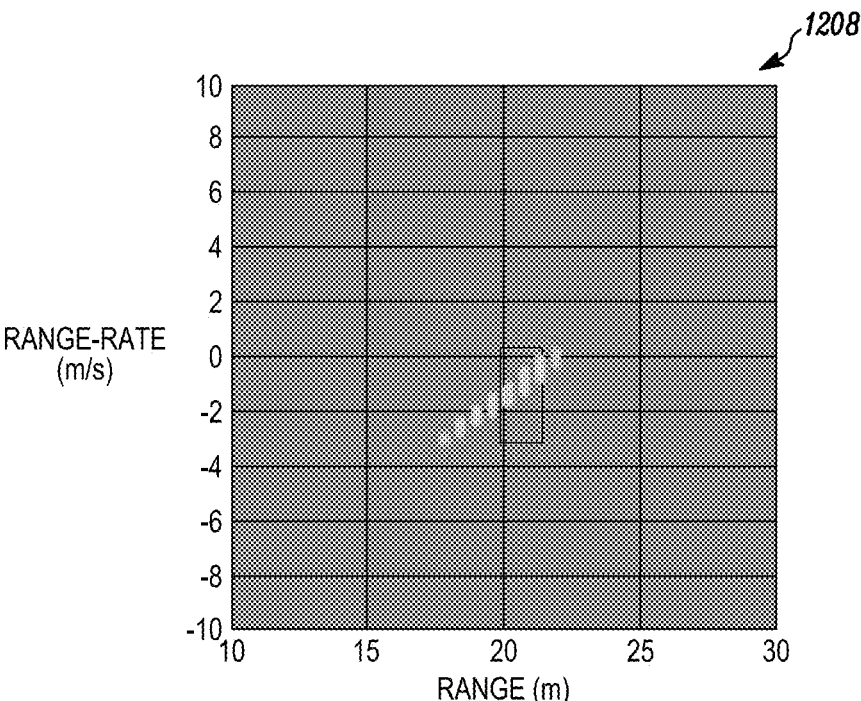

FIGS. 12A and 12B are graphical representations of example outputs generated by an output generation module according to the principles of the present disclosure.

Figures 13A, 13B:
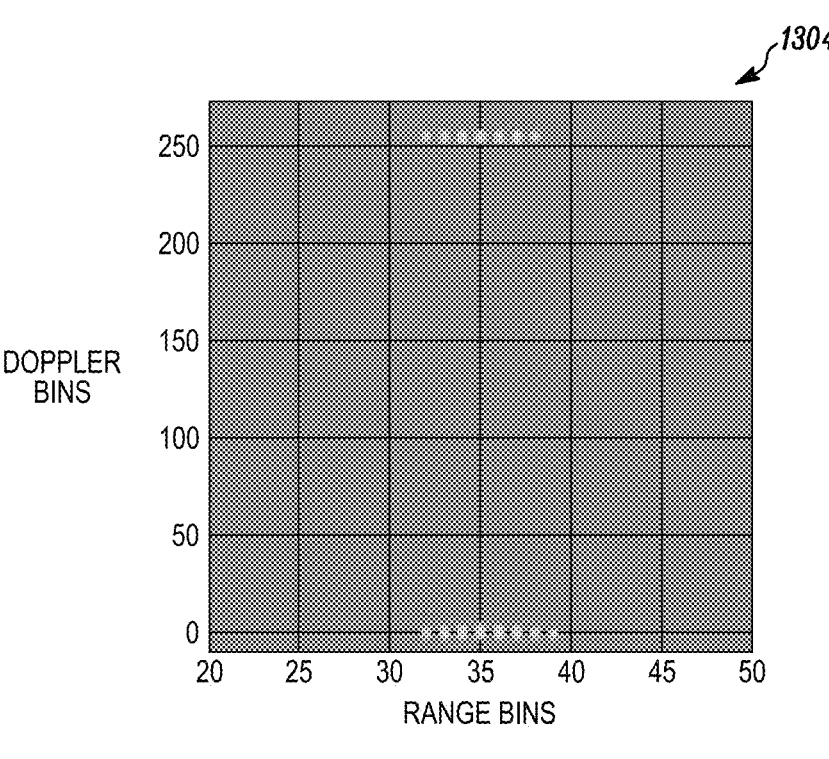

FIGS. 13A and 13B are graphical representations of example outputs generated by an output generation module according to the principles of the present disclosure.

In the drawings, reference numbers may be reused to identify similar and/or identical elements.

DETAILED DESCRIPTION

Introduction

In various implementations, a radar simulator can be used by engineers to perform operations associated with a radar system's hardware and/or software and/or to improve the development of radar design, radar testing, and/or signal processing, among others. Current radar simulators are not capable of accurately and efficiently simulating micro-motions (for example, secondary motions) of target objects such as vulnerable road users (for example, pedestrians and/or cyclists, among others). For example, current radar simulators do not accurately calculate the micro-Doppler effects and/or shifts of the target objects. Current radar simulators may use thousands of CAD files per time frame to simulate motion of a pedestrian, however this is evidenced to be time-intensive and expensive, and to require extensive computing resources.

A high-fidelity radar simulator is configured to accurately and efficiently simulate physical activities of target objects. A physical activity may be associated with a target object walking, running, jumping, dancing, and/or riding a bicycle, among others. The simulator is configured to simulate main motions and micro-motions of the target objects to accurately simulate the physical activities. The micro-motions include secondary motions of the target objects that may be different than the main motions of the target objects.

In various implementations, a main motion may be associated with movement of a torso of a target object associated with a human. For example, the torso may be moving at a first velocity. A secondary motion may be associated with movement of one or more body parts that are connected to the torso (for example, an arm, a hand, a leg, a foot, a head, etc.) and/or a rotational movement of the one or more body parts relative to the torso, among others. For example, legs of the target object may be moving at a second velocity that is different than the first velocity.

The simulator simulates the micro-motions of target objects to identify vulnerable road users (for example, pedestrians and/or cyclists, among others) and to distinguish the vulnerable road users from other target objects. The simulator is configured to calculate the micro-Doppler effects and/or shifts of the target objects to accurately simulate the micro-motions of the target objects. The micro-Doppler effects and/or shifts may be associated with small changes in the Doppler frequency of a radar that are caused by the secondary motions. The micro-Doppler effect and/or shift may introduce tiny variations in the radar signal's frequency that are distinct from the Doppler effects and/or shifts of the main motions of the target object.

High-Level Diagram

Figure 1:
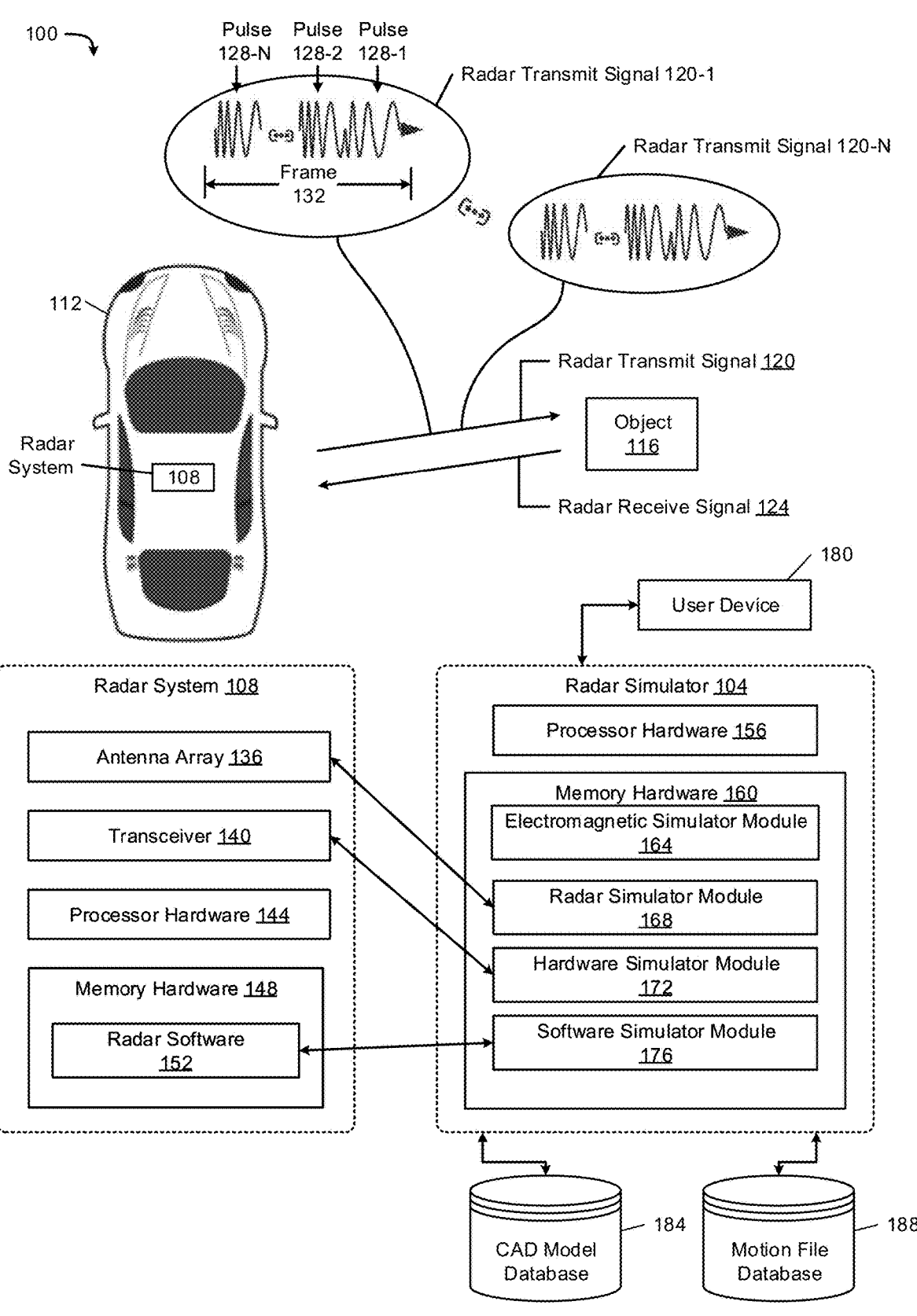
FIG. 1 is a high-level block diagram of an example environment in which a radar simulator models one or more features of a radar system.

FIG. 1 is a high-level block diagram of an example environment 100 in which a radar simulator 104 (for example, a high-fidelity radar simulator) models one or more features and/or components of a radar system 108. The radar system 108 may be mounted to and/or integrated within a vehicle 112. The radar system 108 is configured to detect one or more objects 116 that are proximate to the vehicle 112.

In various implementations, the radar system 108 may be mounted to a top, an underside, a front side, a rear side, a left side, and/or a right side of the vehicle 112. The vehicle 112 may include a set of radar systems 108. For example, the vehicle 112 may include a first rear-mounted radar system 108 positioned proximate a left side of the vehicle 112 and a second rear-mounted radar system 108 positioned proximate a right side of the vehicle 112. In various implementations, locations of the set of radar systems 108 may be selected to provide a particular field of view that encompasses a region of interest in which the one or more objects 116 may be present. For example, a field of view may include a 360-degree field of view, one or more 180-degree fields of view, and/or one or more 90-degree fields of view, among others.

In various implementations, a vehicle 112 may include a passenger car, a SUV, a truck, a van, a bus, a motorcycle, a tractor, a semi-trailer truck, a vehicle used in connection with construction, a bicycle, a train, a trolley car, a boat, a ship, an airplane, a helicopter, and/or a satellite, among others. In various implementations, the radar system 108 may be mounted to any type of moving platform such as moving machinery and/or robotic equipment, among others.

In various implementations, the vehicle 112 may include one or more systems that use data provided by the radar system 108. For example, the vehicle 112 may include a driver assistance system and/or an autonomous driving system, among others. The driver assistance system may use data provided by the radar system 108 to monitor one or more blind spots of the vehicle 112 and/or alert a driver of the vehicle 112 of a potential collision with an object 116. The autonomous driving system may use the data provided by the radar system 108 to move the vehicle 112, avoid collisions with objects 116, perform emergency braking, change lanes, and/or adjust a speed of the vehicle 112, among others.

In various implementations, an object 116 may be composed of one or more materials that reflect radar signals. The object 116 may include a moving and/or a stationary object. For example, the object 116 may include a vulnerable road user (for example, a pedestrian and/or a cyclist, among others), another vehicle, an animal, a road barrier (for example, a traffic cone, a concrete barrier, a guard rail, and/or a fence, among others), a tree, a building, and/or a house, among others.

In various implementations, the radar system 108 may include a continuous wave and/or pulsed radar, a frequency modulated and/or phase modulated radar, a multiple-input-single-output (MISO) radar, a multiple-input multiple-output (MIMO) radar, and/or a combination thereof, among others. In various implementations, the radar system 108 may use a code division multiple access (CDMA) scheme. The radar system 108 is configured to transmit at least one radar transmit signal 120 to detect an object 116. At least a portion of a radar transmit signal 120 is reflected by the object 116 and returned to the radar system 108 in a form of a radar receive signal 124. The radar system 108 is configured to receive the radar receive signal 124 and process the radar receive signal 124 to provide data to one or more systems of the vehicle 112.

In various implementations, a radar receive signal 124 may represent a delayed version of a radar transmit signal 120 at the radar system 108. The amount of delay may be proportional to a slant range (for example, distance) of the radar system 108 to an object 116. The delay may include a time it takes the radar transmit signal 120 to propagate from the radar system 108 to the object 116 and a time it takes the radar receive signal 124 to propagate from the object 116 to the radar system 108. In response to the object 116 and/or the radar system 108 being in motion, the radar receive signal 124 may be shifted in frequency relative to the radar transmit signal 120 due to a Doppler effect. In various implementations, characteristics of the radar receive signal 124 may be dependent upon motion of the object 116 and/or motion of the vehicle 112.

In various implementations, a radar transmit signal 120 and/or a radar receive signal 124 may include frequencies between one and four hundred gigahertz (GHz) and/or may include bandwidths between one and nine hundred megahertz (MHz).

In various implementations, the radar transmit signal 120 and/or the radar receive signal 124 may include multiple signals that each have a distinct waveform. For example, the radar transmit signal 120 may include radar transmit signals 120-1 . . . 120-N and/or the radar receive signal 124 may include multiple radar receive signals (not shown). Each radar transmit signal 120 and/or each radar receive signal 124 may include multiple pulses—in FIG. 1, pulses 128-1, 128-2 . . . 128-N of the radar transmit signal 120-1 are illustrated.

In various implementations, individual frequencies of the pulses may increase or decrease over time. For example, the radar system 108 may employ a single slope cycle to linearly increase the individual frequencies over time. The radar system 108 may employ various other types of frequency modulation including a two-slope cycle and/or a non-linear frequency modulation, among others. The quantity of pulses within a time frame 132 and/or transmission characteristics of the pulses (for example, bandwidth, center frequency, transmit power, etc.) may be selected to achieve a desired detection range, range resolution, and/or Doppler resolution for detecting an object 116.

In various implementations, the radar system 108 may transmit the pulses 128-1 to 128-N in a continuous sequence to implement a continuous wave radar. In some examples, the radar system 108 may transmit the pulses 128-1 to 128-N in a time-separated sequence to implement a pulsed radar. In various implementations, a radar transmit signal 120 may include multiple time frames 132. A time frame 132 may include multiple chirps (i.e., pulses). For example, a time frame 132 may include 32 chirps, 64 chirps, and/or 128 chirps, among others. The time frame 132 may include a duration of 8 ms, 15 ms, 30 ms, and/or 50 ms, among others. The pulses enables the radar system 108 to make multiple observations of an object 116 over a time period of a time frame 132.

In various implementations, the radar system 108 may employ multiple access techniques to support MIMO operations. For example, a time division multiple access (TDMA) scheme, a code division multiple access (CDMA) scheme, a Doppler division multiple access (DDMA) scheme, or any other method to ensure orthogonality between transmit signals in a MIMO implementation. For TDMA, the radar system 108 may delay the transmission of the radar transmit signals 120-1 to 120-N by different amounts so that each signal can occur within a separate time slot. For CDMA, the radar system 108 may encode the radar transmit signals 120-1 to 120-N using respective coding sequences that are orthogonal to each other. For instance, a first coding sequence may be used to generate the first radar transmit signal 120-1 and/or a second coding sequence may be used to generate the second radar transmit signal. The first coding sequence may cause a phase of the second pulse 128-2 to be offset by 180 degrees from a phase of the first pulse 128-1. The second coding sequence may cause a phase of the second pulse 128-2 to be offset by zero degrees from a phase of the first pulse 128-1.

In various implementations, the radar system 108 may include at least one antenna array 136 and at least one transceiver 140 to transmit the radar transmit signal 120 and receive the radar receive signal 124. The antenna array 136 may include at least one transmit antenna element and at least one receive antenna element. In various implementations, to implement a MIMO radar, the antenna array 136 may include multiple subarrays of transmit antenna elements and receive antenna elements. A quantity of transmitting subarrays and a quantity of receiving subarray may be identical or different. In various implementations, the antenna elements within the antenna array 136 may be circularly polarized, horizontally polarized, vertically polarized, and/or may include a combination thereof, among others.

In various implementations, the radar system 108, via the antenna array 136, may form beams that are steered, un-steered, wide, and/or narrow, among others. The steering and shaping of the beams may be achieved via analog beamforming and/or digital beamforming. In various implementations, the one or more transmitting subarrays may have an un-steered omnidirectional radiation pattern and/or may produce a wide steerable beam to illuminate a large volume of space. The receiving subarrays may include multiple receive antenna elements that may generate hundreds of narrow steered beams via digital beamforming to achieve target angular accuracies and angular resolutions. The foregoing may enable the radar system 108 to efficiently monitor an external environment and detect one or more objects 116 within a region of interest.

In various implementations, the transceiver 140 may include circuitry and logic for transmitting and receiving radar signals via the antenna array 136. The transceiver 140 may include one or more amplifiers, one or more mixers, one or more switches, one or more analog-to-digital converters, and/or one or more filters for conditioning the radar signals. The logic of the transceiver 140 may perform in-phase/quadrature (I/Q) operations such as modulation and/or demodulation. In some examples, the transceiver 140 may include at least one transmitter and at least one receiver.

In various implementations, the transceiver 140 may include multiple transmitters that are respectively coupled to the transmitting subarrays of the antenna array 136. Each of the transmitters may include multiple transmit chains that are respectively coupled to a transmit antenna element of a transmitting subarray. Each of the transmitters may be configured to generate a radar transmit signal 120. The transmit chains may enable beamforming techniques to adjust a beam shape and/or a direction associated with the transmitted radar transmit signal 120.

The various implementations, the transceiver 140 may include multiple receivers. The receivers may be respectively coupled to a receiving subarray of the antenna array 136. Each of the receivers may include multiple receive chains that are respectively coupled to a receive element of a receiving subarray. Each of the receivers may be configured to receive one or more reflected versions of the radar transmit signal 120. The receive chains may enable beamforming techniques to individually adjust amplitudes and/or phases of signals that are processed by the receive chains.

In various implementations, each of the transmitting subarrays of the antenna array 136 and an associated transmitter of the transceiver 140 may form a transmit channel. Each of the receiving subarrays of the antenna array 136 and an associated receiver of the transceiver 140 may form a receive channel. In various implementations, the transmit channels and the receive channels may be combined in different ways to form multiple transmit-receive channel pairs. For example, a first transmit channel and a first receive channel may form a first transmit-receive channel pair and a second transmit channel and a second receive channel may form a second transmit-receive channel pair, etc.

In various implementations, the radar system 108 may include processor hardware 144 and memory hardware 148. The memory hardware 148 may include radar software 152. In various implementations, the radar software 152 may be configured to analyze the radar receive signal 124, detect the one or more objects 116, and/or determine one or more characteristics (for example, position and/or velocity, among others) of the objects 116, among others.

In various implementations, the radar simulator 104 may be configured to model hardware and/or software of the radar system 108 to evaluate performance of the radar system 108 in a simulated environment. The radar simulator 104 may be used to evaluate different system designs (for example, hardware configurations and/or operational modes, among others), test different versions of the radar software 152, and/or verify performance requirements of the radar system 108, among others. The radar simulator 104 enables its users to quickly discover problems within the radar system 108 such as during design, integration, and/or testing phases of the radar system 108.

In various implementations, the radar simulator 104 may perform operations to simulate hardware of the of radar system 108 (for example, antenna array 136 and/or transceiver 140, among others) and/or the radar software 152, among others. In various implementations, the radar simulator 104 may be configured to account for non-ideal characteristics of the radar system 108 and the environment 100. For example, the radar simulator 104 may be configured to model phase noise, waveform non-linearities, and/or uncorrelated noise within the transceiver 140, among others. The radar simulator 104 may include a similar noise floor and/or dynamic range as the radar system 108.

In various implementations, the radar simulator 104 may include processor hardware 156 and memory hardware 160. The memory hardware 160 may store an electromagnetic simulator module 164, a radar simulator module 168, a hardware simulator module 172, and/or a software simulator module 176, among others.

Figure 2:
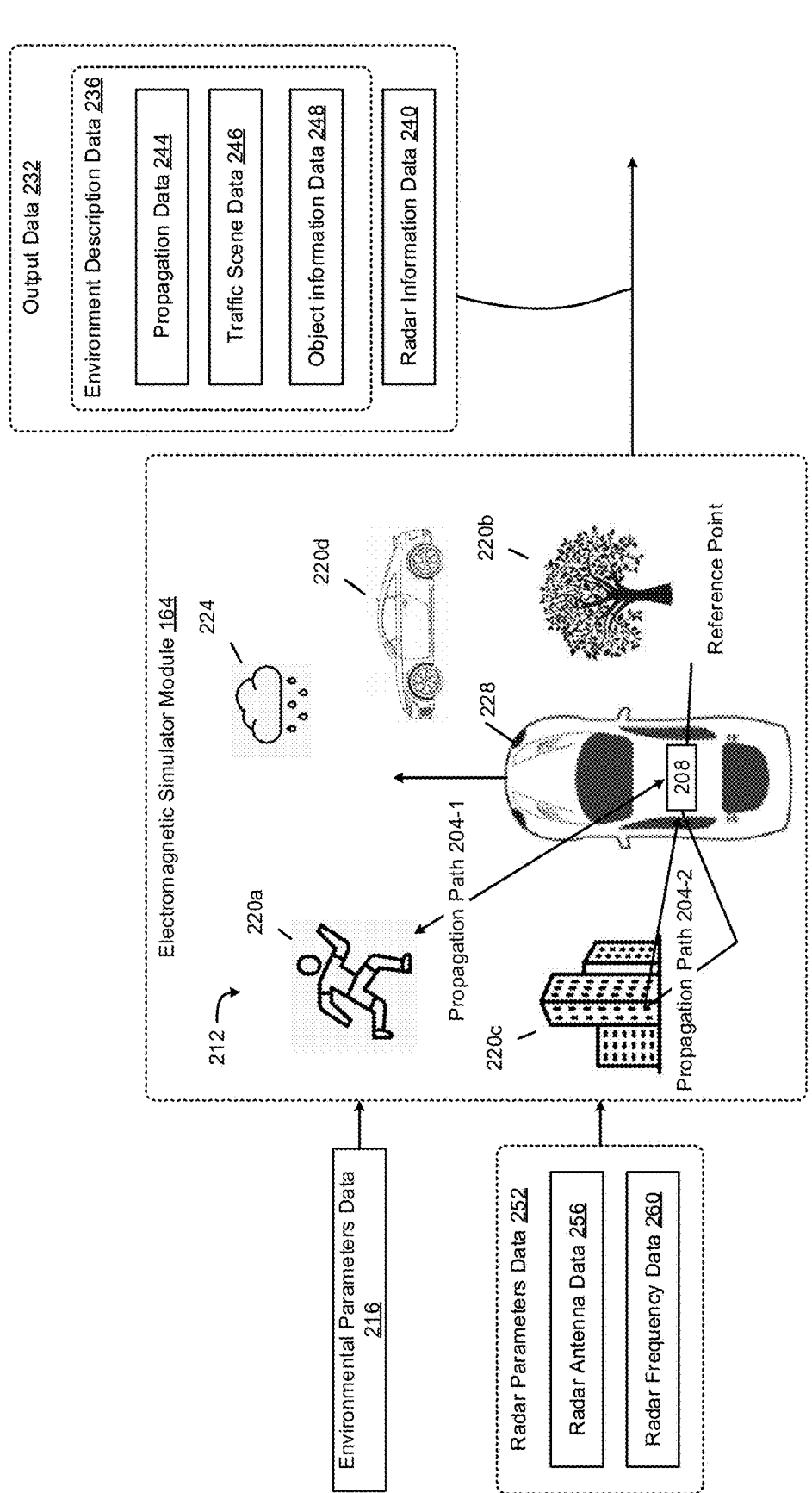
FIG. 2 is a functional block diagram of an example electromagnetic simulator module according to the principles of the present disclosure.

In various implementations, the electromagnetic simulator may be configured to generate environment description data (see, e.g., FIG. 2). The radar simulator module 168 may be configured to process the environment description data generated by the electromagnetic simulator module 164, transform the environment description data into a form that is usable by the hardware simulator module 172, and/or adjust the environment description data to account for an antenna response of the antenna array 136, among others. In various implementations, the radar simulator module 168 may be configured to analyze the environment description data to generate various reports and/or outputs (for example, simulations) for display on one or more user devices 180. A report and/or an output may be used by a user of a user device 180 to evaluate performance of the radar system 108. A user device 180 may include a desktop computer, a laptop computer, a tablet, and/or a smartphone, among others.

In various implementations, the hardware simulator module 172 may be configured to model the transceiver 140. For example, the hardware simulator module 172 may be configured to perform operations that simulate waveform generation, modulation, demodulation, multiplexing, amplification, frequency conversion, filtering, and/or analog-to-digital conversion, among others. The hardware simulator module 172 may be configured to verify different hardware configurations and/or operations modes of the radar system 108.

In various implementations, the software simulator module 176 may be configured to model the radar software 152 of the radar system 108. For example, the software simulator module 176 may be configured to perform digital baseband processing operations that simulate operations performed by the processor hardware 144 of the radar system 108. In various implementations, the operations may include performing Fourier transforms (for example, Fast Fourier transforms), noise floor estimation, clutter map generation, constant-false alarm rate thresholding, object detection, and/or object position estimation (for example, digital beamforming), among others. The software simulator module 176 may be configured to verify software operation requirements and/or evaluate various versions of the radar software 152, among others.

In various implementations, the radar simulator 104 may include and/or may be communicatively coupled to a set of databases. The set of databases may include a CAD model database 184 and/or a motion file database 188, among others. In various implementations, the CAD model database 184 may store multiple CAD models (for example, MakeHuman models, etc.) and/or CAD files that may be used to simulate and/or model the objects. In response to an object being or including a human, a CAD model may be associated with a mesh model that includes multiple vertices and/or bone information that depict the human. In various implementations, the motion file database 188 may store multiple motion files (for example, biovision hierarchy (BVH) files). In various implementations, a motion file may be executed in conjunction with a CAD model to simulate motion of an object. For example, in response to the object including the human, the motion file may be used to move at least some of the vertices and/or the bones of the human to simulate the motion of the human.

Block Diagrams

FIG. 2 is a functional block diagram of an example electromagnetic simulator module 164 according to the principles of the present disclosure. In various implementations, the electromagnetic simulator module 164 may be configured to generate at least one simulated electromagnetic signal (for example, a radio frequency signal) and/or evaluate propagation and scattering effects of the simulated electromagnetic signal, among others. For example, the electromagnetic simulator module 164 may be configured to evaluate one or more propagation paths of the simulated electromagnetic signal that originate form a reference point 208 and return to the reference point 208 within a simulated environment 212. In various implementations, a propagation path may include a direct line of sight path (for example, propagation path 204-1) and/or an indirect path associated with multipath propagation (for example, propagation path 204-2), among others. In various implementations, the electromagnetic simulator module 164 may use ray tracing to determine various types of propagation paths.

In various implementations, the electromagnetic simulator module 164 may be configured to determine one or more characteristics of the propagation paths within the simulated environment 212. In various implementations, the electromagnetic simulator module 164 may be configured to select and/or receive environmental parameters data 216 that may specify one or more characteristics of one or more simulated objects (for example, position, velocities, and/or material composition of the simulated objects). In various implementations, at least some of the environmental parameters data 216 may be inputted to the radar simulator 104 via the user device 180.

In various implementations, the electromagnetic simulator module 164 may be configured to generate the simulated environment 212 based on the environmental parameters data 216. In various implementations, the simulated environment 212 may include one or more simulated objects. In various implementations, a simulated object may include a human (for example, human object 220a), a tree (for example, tree object 220b), a building (for example, building object 220c), and/or a vehicle (for example, vehicle object 220d), among others. In various implementations, the simulated environment 212 may include various types of environmental conditions 224 (for example, weather, terrain, road geometries, traffic rules, and/or traffic conditions, among others).

In various implementations, the simulated environment 212 may include a simulated vehicle 228 and the reference point 208 may represent a location on the simulated vehicle 228 that corresponds to the location of the radar system 108 on the vehicle 112 of FIG. 1. In various implementations, the electromagnetic simulator module 164 may be configured to generate output data 232 that may be used in connection with additional simulator processing steps. In various implementations, the output data 232 may include environment description data 236 and/or radar information data 240, among others. In various implementations, the environment description data 236 may include propagation data 244, traffic scene data 246, and/or object information data 248, among others.

In various implementations, the electromagnetic simulator module 164 may generate the environment description data 236 which may be dynamic. For example, the environment description data 236 may vary over time as the reference point 208 on the vehicle 228 and/or the objects within the simulated environment 212 may move. The environment description data 236 may include complex data with amplitude, phase, and/or frequency information, among others.

In various implementations, the electromagnetic simulator module 164 may use radar parameters data 252 to generate the environment description data 236. The radar parameters data 252 may include information regarding the radar system 108 and/or radar transmit signal 120, among. In various implementations, the radar parameters data 252 include radar antenna data 256 and/or radar frequency data 260, among others.

In various implementations, the radar antenna data 256 may include data associated with a maximum operation frequency of the radar system 108 and/or a pulse-repetition frequency (PRF) of the radar system 108, among others. The maximum operation frequency may be used to determine a spatial resolution of the radar system 108 and/or the PRF may be used to determine an unambiguous range of the radar system 108.

In various implementations, the electromagnetic simulator module 164 may use ray tracing to generate the environment description data 236. To improve efficiency, the rays may be transmitted and/or received from the reference point 208 which may represent a center of the radar system 108. In various implementations, the electromagnetic simulator module 164 may assume that the antenna array 136 includes an omnidirectional pattern for both transmission and reception. Based on the foregoing, the ray tracing may be performed without having to consider separate transmit-receive channel pairs and/or differences between individual subarrays of the antenna array 136.

In various implementations, the electromagnetic simulator module 164 may be configured to generate propagation data 244. In various implementations, the propagation data 244 may include a list of the propagation paths (for example, rays) and/or characteristics of electromagnetic signals that propagate along the propagation paths. The characteristics may include relative amplitude, Doppler-frequency, time of flight, and/or angles of departure and arrival, among others. In various implementations, the electromagnetic simulator module 164 may be configured to generate the propagation data 244 without relying on information regarding the radar system 108.

In various implementations, the electromagnetic simulator module 164 may configured to generate traffic scene data 246 and/or object information data 248. In various implementations, the traffic scene data 246 may include data associated with the simulated environment 212. For example, the traffic scene data 246 may include the quantity of simulated objects and/or the environmental conditions 224 within the simulated environment 212, among others. In various implementations, the object information data 248 may include data associated with the simulated objects within the simulated environment 212. For example, the types of the simulated objects, geometries of the simulated objects, and/or characteristic associated with the simulated objects (for example, position, velocities, and/or material composition of the simulated objects), among others.

In various implementations, the radar simulator 104 (for example, the electromagnetic simulator module 164 and/or the radar simulator module 168) may use an image theory-based shooting and bouncing ray method to simulate wave propagation and scattering from an object. In some instances, the method may be used to calculate a radar cross section (RCS) of the object. The RCS may be associated with a measure of how detectable the object is by the radar system 108. The radar simulator 104 may be configured to discretize a geometry of the object into small facets, generate an acceleration data structure to sort the facets, launch uniformly distributed rays towards the object, apply a ray tracing algorithm to determine the propagation of the ray and intersecting positions between rays and the object, and/or calculate the scattered fields for each ray and at each bouncing point with physical optics and combine the results to determine the RCS of the object, among others.

Figure 3:
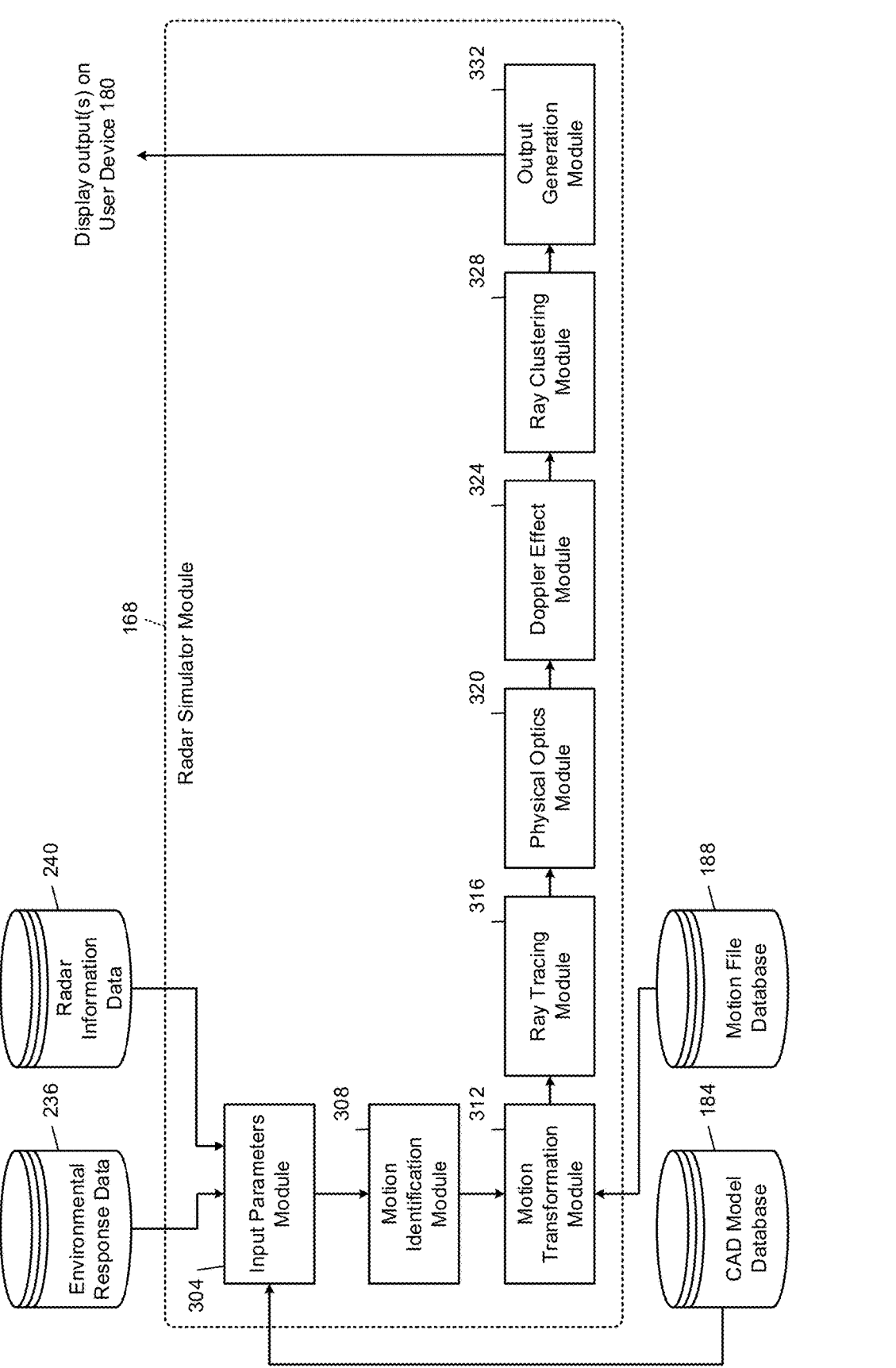
FIG. 3 is a functional block diagram of an example radar simulator module according to the principles of the present disclosure.

FIG. 3 is a functional block diagram of an example radar simulator module 168 according to the principles of the present disclosure. In various implementations, the radar simulator module 168 may be configured to simulate motion of an object including micro-motions of the object. The object may be associated with an object 116 of FIG. 1. In response to the object including a human, the radar simulator module 168 may be configured to simulate a physical activity of the human. For example, the radar simulator module 168 may be configured to simulate the human: walking, running, jumping, dancing, and/or riding a bicycle, among others.

In various implementations, an input parameters module 304 may receive environment description data 236 and/or radar information data 240 from the electromagnetic simulator module 164. The environment description data 236 may include the traffic scene data 246 and/or the object information data 248, among others. In various implementations, the input parameters module 304 may receive one or more CAD models from the CAD model database 184 to model an object. In response to the object including a human, a CAD model may be associated with a mesh model that includes multiple vertices and/or bone information to model the human (for example, the human object 220a).

In various implementations, a motion identification module 308 may identify the motion of an object at a specific time frame of simulation. The motion identification module 308 may identify the positions of each vertex of the vertices from a CAD model. Each vertex may include a location associated with a three-dimensional coordinate system. For example, the location of a vertex may be defined by the coordinates (x, y, z). In various implementations, a motion transformation module 312 may transform all of the positions of the vertices and may determine and/or calculate a velocity of each facet on the object. A facet may be associated with a distinct aspect, feature, and/or component of the object.

In various implementations, a ray tracing module 316 may be configured to perform ray tracing simulation to simulate wave propagation of a set of rays to an object and reflection of the rays from the object (for example, along the propagation paths). For example, the ray tracing module 316 may launch the set of rays (for example, electromagnetic rays) and may trace the rays to simulate the wave propagation and reflection in the simulated environment 212.

In various implementations, the ray tracing module 316 may be configured to determine a 3D boundary for an object and/or an image of the object and calculate an angular occupancy grid with respect to a source of the rays. In some examples, a resolution of the angular grid may be 0.1 degree. The ray tracing module 316 may be configured to launch uniformly distributed and/or sparse rays towards the object and/or to the angular grid occupied by the object and/or the image of the object. The ray tracing module 316 may be configured to apply a ray tracing algorithm to determine the propagation of the ray and intersecting positions between rays and the object and/or a length of each ray up to a determined number of ray bounces (for example, 2). The ray tracing module 316 may be configured to calculate angular ray densities of the rays based on the length of the rays. Subsequently, the ray tracing module 316 may adaptively launch a set of rays with different angular ray densities to the object and/or the image of the object. A ray density in a specific direction may be determined by the range of object potentially hit by the ray. Then, a ray-tracing process may be performed to determine where the rays hit and go.

In various implementations, a physical optics module 320 may perform physical optics (PO) simulation to simulate wave scattering of the rays. In various implementations, a Doppler frequency shift may accumulate along the path of the rays (for example, along a propagation path). In various implementations, the physical optics module 320 may apply, for each bounce of the rays a large-element physical optics method to calculate the scattered fields in a direction back to the reference point 208 (for example, directly or indirectly). In various implementations, a Doppler effect module 324 may identify and/or calculate the Doppler shift and/or the micro-Doppler shifts for each ray. In some examples, the Doppler effect module 324 may accumulate the Doppler Frequency shift at every step of the ray bouncing.

In various implementations, a ray clustering module 328 may cluster similar rays. For example, to reduce the complexity of post-signal processing, the ray clustering module 328 may combine rays with similar characteristics based on a clustering algorithm. The characteristics may include direction and/or angle of ray, distance and/or range of ray, Doppler shift of ray, amplitude and/or intensity of ray, polarization of ray, frequency of ray, temporal information of ray, multi-static information of ray, phase information of ray, spectral information of ray, texture or pattern of ray, and/or spatial distribution of ray, among others. In various implementations, an output of the ray clustering module 328 may be transmitted to at least one of the radar simulator module 168, the hardware simulator module 172, or the software simulator module 176 such that the output may be applied to a radar frame by simulating a single pulse. For example, the output of the ray clustering module 328 may be transmitted to the radar simulator module that includes a radar model. In various implementations, an output generation module 332 may generate and/or transform various output (for example, motion simulations of objects) for display on a user device 180 (see, for example, FIGS. 11A-11D).

In various implementations, only one simulation instance is required for simulating one frame radar data, and different rays are not necessary to have the same frequency shift. In the post processing stage, the rays' information will be converted into the radar signals with multiple frequency, chirps (i.e., pulses) and channels. Because different rays may contain different frequency shifts, the final radar signals may exhibit micro-Doppler effect.

Flowcharts

Figure 4:
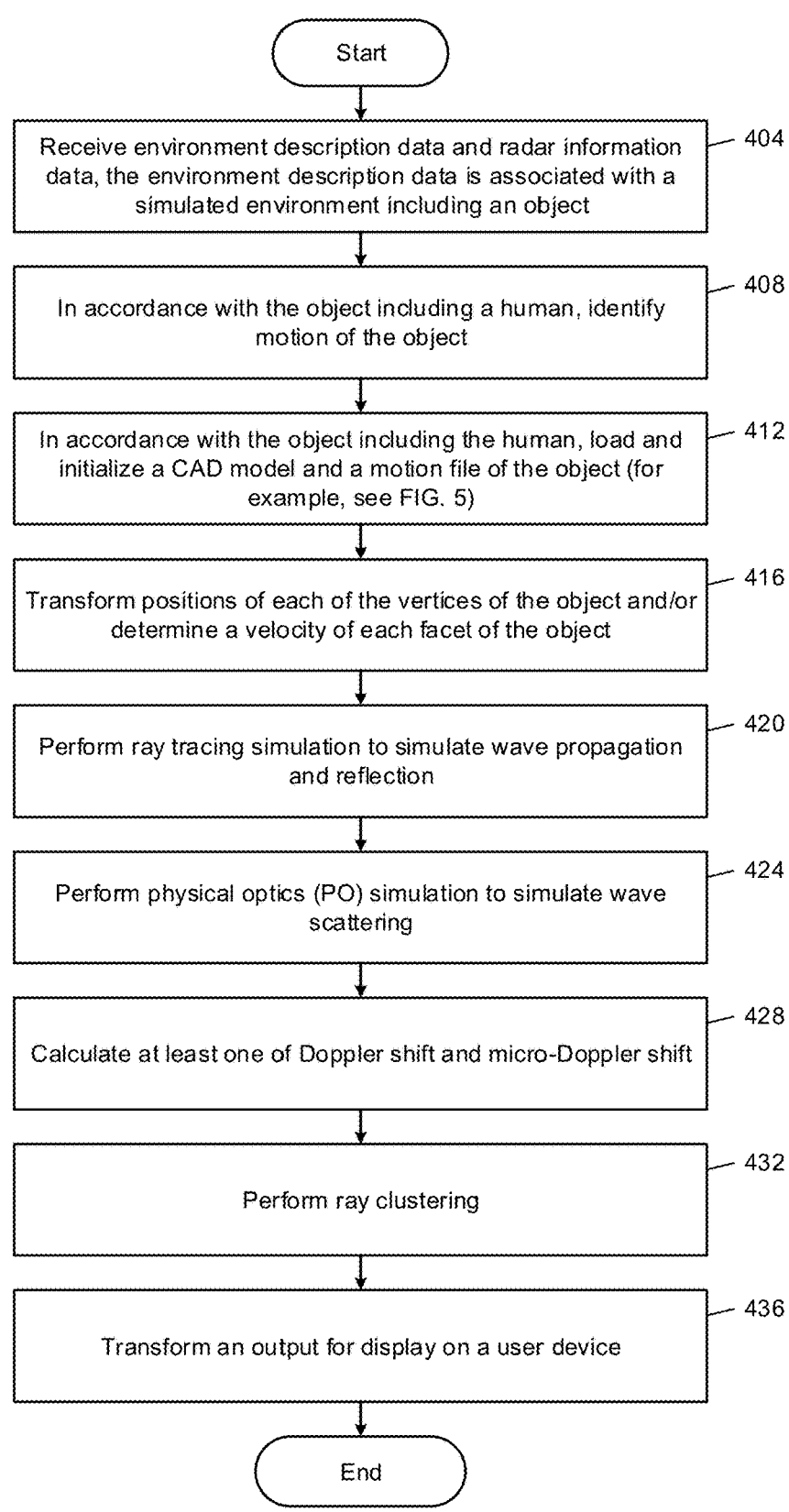
FIG. 4 is a flowchart depicting an example micro-Doppler simulation by a radar simulator according to the principles of the present disclosure.

FIG. 4 is a flowchart depicting an example micro-Doppler simulation by the radar simulator 104 according to the principles of the present disclosure. Control begins at 404. At 404, environment description data 236 and radar information data 240 from the electromagnetic simulator module 164 may be received at the radar simulator module 168. The environment description data 236 may be associated with a simulated environment 212 including an object. At 408, in response to the object including a human (for example, the human object 220a), motion of the object may be identified. At 412, in response to the object including the human, a CAD model and a motion file of the object may be loaded and initialized. At 416, positions of each of the vertices of the object may be transformed and/or a velocity of each facet of the object may be determined and/or calculated. Additional details of loading and initializing the CAD model and the motion file, transforming the positions, and determining the velocities will be described further on in this specification with reference to FIG. 5.

At 420, ray tracing simulation to simulate wave propagation and reflection may be performed via the ray tracing module 316. In various implementations, performing the ray tracing simulation may include launching a set of rays from a ray source (for example, from reference point 208) towards the object and determining a set of propagation paths (for example, the propagation paths 204-1 and 204-2) of the set of rays from the source to the object and a set of reflection paths of the set of rays from the object to a ray receiver (for example, back to reference point 208). At 424, physical optics (PO) simulation to simulate wave scattering may be performed via the physical optics module 320. In various implementations, performing the physical optics simulation may include determine a set of scattered fields associated with the set of reflection paths of the set of rays. At 428, the at least one of a Doppler shift and a micro-Doppler shift for each may be determined and/or calculated via the Doppler effect module 324. At 432, ray clustering to reduce complexity of post-signal processing may be performed via the ray clustering module 328. At 436, various outputs may be generated and transformed for display on a user device 180 via the output generation module 332. Then, control ends. Additional details of an output will be described further on in this specification with reference to FIGS. 11A-11D.

Figure 5:
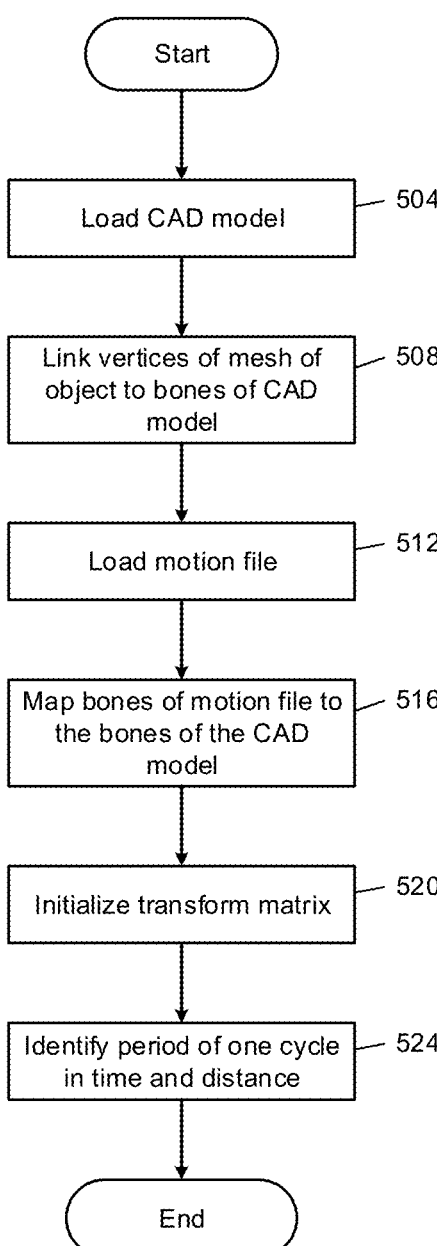
FIG. 5 is a flowchart depicting an example process of loading and initializing a CAD model and a motion file of an object by a radar simulator module according to the principles of the present disclosure.

FIG. 5 is a flowchart depicting an example process of loading and initializing a CAD model and a motion file of an object via the radar simulator module 168 according to the principles of the present disclosure. Control begins at 504. At 504, a CAD model from the CAD model database 184 may be loaded. The CAD model may be associated with the object. At 508, the vertices of the mesh of the object may be linked to the bones defined in the CAD model. At 512, a motion file from the motion file database 188 may be loaded. The motion file may specify the motion of the all bones for all time frames in a period of time. At 516, the bones of the motion file may be mapped to the bones of the CAD model, for example, with a retargeting function.

At 520, a transform matrix may be initialized. The transformation matrix may be used to transform the positions and orientations of all bones with given motion parameters, such as the rotated angle and positions of each joint of the skeleton (for example, defined by the bones) of the object. The position of each vertex may be determined by:

$$v'_j = \sum_i w_{ij} T_i B_i^{-1} v_j$$

where $$v'_j$$

denotes the position of jth vertex in the current pose, $v_j$ is the position of jth vertex at the rest pose of the object.

$$B_i^{-1}$$

is the 4×4 inverse transformation matrix of ith bone in the rest pose, $T_i$ denotes the transformation matrix of ith bone in the current pose of the object, and $w_{ij}$ denotes the weight, and $\sum_i w_{ij}=1$.

The operation $$B_i^{-1} v_j$$

will transfer the position of jth vertex from global coordinate to the local coordinate of ith bone in the rest pose, and if the rotation angles of all bones in the rest pose are 0 (which is the most common case), the transformation matrix $$B_i^{-1}$$

may be a translation matrix, which moves the position of $v_j$, therefore:

$$B_i^{-1} v_j = v_j - O_i$$

where $O_i$ denotes the reference position of ith bone.

The overall transformation matrix of ith bone in the current pose $T_i$ is calculated through the matrix multiplication of all the transformation matrix from the ith bone and its parent node until to the root bone, which usually denotes the hip of the object:

$$T_i = M_{i_0} M_{i_1} \dots M_{i_{i-1}} M_i$$

where $M_i$ denotes the transformation matrix of ith bone with respect to its parent bone. In one convention, $M_i$ can be described by:

$$M_i = M_{it} M_{iz} M_{ix} M_{iy}$$

where $M_{it}$ denotes a translation matrix, which is given by:

$$M_{it} = \begin{bmatrix} 1 & 0 & 0 & Tx \\ 0 & 1 & 0 & Ty \\ 0 & 0 & 1 & Tz \\ 0 & 0 & 0 & 1 \end{bmatrix}$$

where Tx, Ty and Tz are the position of the reference point of ith bone with respect to the reference point of its parent bone in the rest pose. $M_{ix}$, $M_{iy}$ and $M_{iz}$ are the rotation matrix along x, y and z axis, respectively.

Regarding the simulation of a walking motion and/or a jogging motion of the object, the motion can be looped, and therefore only one cycle of motion is needed to simulate the motion. Control proceeds to 524.

At 524, the period of one cycle of the motion in terms of both time and distance is identified. In various implementations, the period time of one cycle may be identified from the motion file. For example, the number of frames $N_f$ that the motion starts to repeat may be counted. In response to the period time of one cycle being identified, the distance can be identified. For example, positions between a reference point (For example, the hip of the object) of the CAD model at frame j and frame j+$N_f$ can be considered as the distance of one cycle for the object with a given height. In various implementations, the default average speed of this motion is calculated by the distance over the time for one cycle of motion. Then, control ends.

Figure 6:
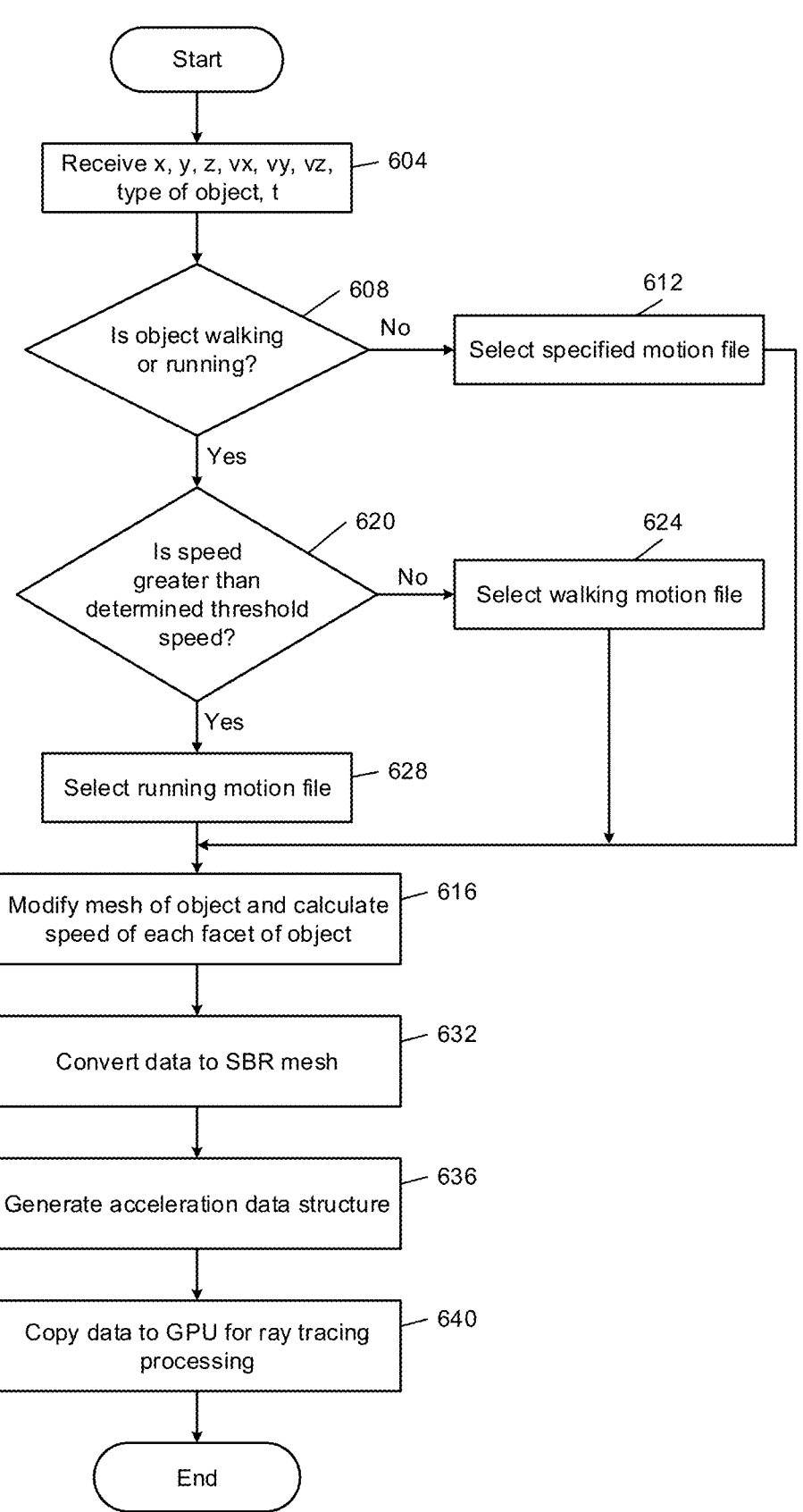
FIG. 6 is a flowchart depicting an example process of loading traffic scene information by a radar simulator module according to the principles of the present disclosure.

FIG. 6 is a flowchart depicting an example process of loading the environment response data 236 (for example, the traffic scene data 246) at a given time frame by the radar simulator module 168 according to the principles of the present disclosure. Control begins at 604. At 604, during the simulation for a specific time frame, information associated with the object including the position, speed, orientation, object type, and motion type may be received. At 608, control determines if the object is walking or running. If not, control proceeds to 612, where the specified motion file (for example, a motion other than walking or running) is selected, and then control proceeds to 616. If, at 608, the object is walking or running, control proceeds to 620.

At 620, control determines if the speed of the object is greater than a determined threshold (such as 1.8 m/s). If not, control selects a walking motion file at 624 and then proceeds to 616. Otherwise, if at 620 the speed of the object is greater than the predetermined threshold, control selects a running motion file at 628 and proceeds to 616.

At 616, control modifies the mesh of the object and calculates speed (i.e., velocity) of each facet of the object. For example, after selecting the motion model, control determines which frame of the motion should be used based on the timestamp and initial frame index at the beginning of the simulation. The motion's frame rate may be determined by both the set speed and the default speed of the object with a motion model and/or the motion file. For example, the default speed of the walking motion for a 1.8 m tall man may be 1.2 m/s, and the default frame rate of motion may be 120 fps (frames per second). If the speed is set to be 1.6 m/s, then control will change the frame rate of the motion to be 160 fps, which means that at one radar frame, the frame index of the motion may be set as $F_i$, and the next radar frame may be set at 100 ms later. Control may apply the motion from the $F_i$+16 frame instead of the $F_i$+12 frame. Next, the control may transform the positions of all vertices of the CAD model according to the motion file, and estimates the velocity of all facets at that frame. The velocity estimation of $j^{th}$ facet at $i^{th}$ frame can be implemented with the following steps: 1) since the positions of all vertices at $i^{th}$ frame are known, control obtains the center position $$P_j^{(i)}$$

of $j^{th}$ facet as the average position of all vertices of that facet. 2) Similarly, control can calculate the position of $j^{th}$ facet at adjacent frames, $$P_j^{(i-1)} \text{ and } P_j^{(i+1)}.$$

3) The velocity of $j^{th}$ facet at $i^{th}$ frame then can be evaluated by:

$$v_j^{(i)} = \frac{1}{2} \left( \frac{P_j^{(i)} - P_j^{(i-1)}}{dt_1} + \frac{P_j^{(i+1)} - P_j^{(i)}}{dt_2} \right)$$

At 632, control translates all of the geometric information and/or data of the object at a given frame into the data compatible for further processing via the radar simulator module 168. At 636, control generates one or more acceleration data structures for performing the ray tracing simulation via the ray tracing module 316. In various implementations, the acceleration data structures for objects without micro-Doppler feature may be pre-calculated before the simulation flow as their geometry will not change during the simulation. But since the geometry of the objects will change over different frames, their acceleration data structure will be updated at every frame. At 640, control may copy data (for example, the acceleration data structures) to a graphics processing unit (GPU) of the simulator 104 for performing the ray tracing simulation. Then, control ends.

Figure 7:
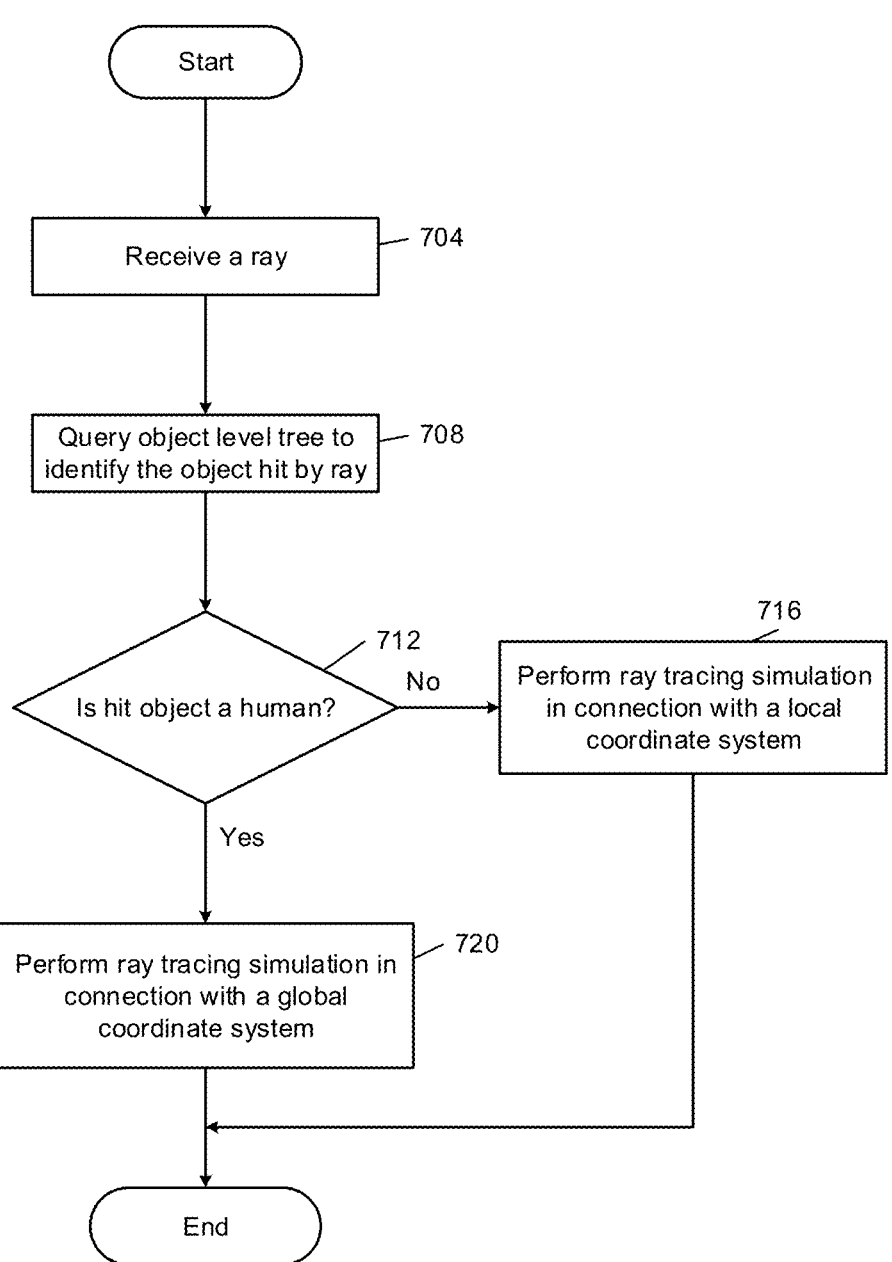
FIG. 7 is a flowchart depicting an example ray tracing process by a ray tracing module according to the principles of the present disclosure.

FIG. 7 is a flowchart depicting an example ray tracing process by the ray tracing module 316 according to the principles of the present disclosure. Control begins at 704. At 704, control receives a ray. At 708, control queries an object level data structure tree (for example, a K-dimensional (KD) tree) to identify the object hit by the ray. At 712, control determines if the object hit is a human. If not, control performs ray tracing simulation in connection with a local coordinate system at 716. If yes at 712, control performs ray tracing simulation in connection with a global coordinate system at 720. Then, control ends.

FIG. 8 is a flowchart depicting an example process of calculating scattered fields and Doppler frequency shift and/or micro-Doppler frequency shift of a ray according to the principles of the present disclosure. Control begins at 804. At 804, control receives one or more ray hits of the object. At 808, control calculates an equivalent surface current of the ray. For example, for the specific bounce of the ray, control may calculate the equivalent surface current and scattered fields based on the scattering directions of the ray. At 812, control calculates the scattered fields (Es) for all return paths to the receiver (for example, back to the reference point 208). In various implementations, after the ray tracing process, every face area (for example, of the object) that a ray hits will generate an equivalent surface current based on the boundary conditions, and the equivalent surface current will radiate scattered fields back to the receiver. Depending on the traffic scene and/or simulated environment 212, there may be many paths for the scattered fields to arrive at the receiver. In various implementations, according to the Huygens principle, the scattered fields from current sources may be determined by:

$$\vec{E}_s(\vec{r}) = \int\int_{s'} \left[ i\omega\mu_0 \vec{J}_s(\vec{r}') \left\{ \left( \frac{3}{k^2R^2} - \frac{3i}{kR} - 1 \right) \hat{R}\hat{R} + \left( 1 + \frac{i}{kR} - \frac{1}{k^2R^2} \right) \overline{\overline{I}} \right\} - \left( ik - \frac{1}{R} \right) (\hat{R} \times \vec{J}_m(\vec{r}')) \cdot \overline{\overline{I}} \right] \frac{e^{ikR}}{4\pi R} ds'$$

where $\vec{r}_s(\vec{J}')$ and $\vec{J}_m(\vec{J}')$ denote the electric and magnetic surface current, k is the wavenumber in free space, $\overline{\overline{I}}$ is the dyadic idemfactor and R is the length of the vector from source point $\vec{J}'$ to observation point $\vec{J}$:

$$R = \frac{\vec{r} - \vec{r}'}{|\vec{r} - \vec{r}'|}, \quad R = |\vec{r} - \vec{r}'|.$$

If the distance R is much larger than the wavelength, i.e. kR>>1, the far-field approximation can be applied to:

$$\vec{E}_s(\vec{r}) = ik\left(\overline{\overline{I}} - \hat{R}\hat{R}\right) \cdot \int\int_{s'} \left[ Z_0\vec{J}_s(\vec{r}') - \left(\hat{R} \times \vec{J}_m(\vec{r}')\right) \right] \frac{e^{ikR}}{4\pi R} ds'$$

The surface currents $\vec{J}_s(\vec{J}')$ and $\vec{J}_m(\vec{J}')$ are defined as:

$$\vec{J}_s =$$

$$\hat{n} \times \left(\vec{H}_i + \vec{H}_r\right) = \frac{1}{Z_0} \left[ Z_0\vec{H}_i \cdot \hat{t}(1 + R_{TM})(\hat{n} \times \hat{t}) + \vec{E}_i \cdot \hat{t}(\hat{n} \cdot \hat{k}_i)(R_{TE} - 1)\hat{t} \right] e^{i\vec{k}_i \cdot \vec{r}},$$

$$\vec{J}_m = -\hat{n} \times \left(\vec{E}_i + \vec{E}_r\right) = \left[ Z_0\vec{H}_i \cdot \hat{t}(\hat{n} \cdot \hat{k}_i)(R_{TM} - 1)\hat{t} - \vec{E}_i \cdot \hat{t}(1 + R_{TE})(\hat{n} \times \hat{t}) \right] e^{i\vec{k}_i \cdot \vec{r}}.$$

where $\vec{E}_i$ and $\vec{H}_i$ are the incident electric and magnetic fields, respectively, $\hat{t}$ is the tangential vector on the surface, defined as $\hat{t} = (\vec{k}_i \times \hat{n})/|\vec{k}_i \times \hat{n}|$, $\vec{k}_i$ is the incident direction unit vector, $\hat{n}$ is the normal vector of the surface, $R_{TM}$ and $R_{TE}$ are the Fresnel reflection coefficients of the surface.

The Fresnel reflection coefficients $R_{TM}$ and $R_{TE}$ are given by:

$$R_{TE} = (\eta_2\cos\theta_1 - \eta_1\cos\theta_2)/(\eta_2\cos\theta_1 + \eta_1\cos\theta_2),$$

$$R_{TM} = (\eta_1\cos\theta_1 - \eta_2\cos\theta_2)/(\eta_1\cos\theta_1 + \eta_2\cos\theta_2).$$

where $\eta_1$ and $\eta_2$ are the characteristic impedance of air and target, $\theta_1$ and $\theta_2$ are the incident and refraction angle with respect to the surface of targets.

In various implementations, for metal materials, $\varepsilon_2$ is very large, $\eta_2$ becomes negligible, and $R_{TE}\approx-1$, $R_{TE}\approx1$. Then $\vec{J}_m\approx0$, and $\vec{J}_s\approx2\hat{n}\times\vec{H}_i$. The equation can be further simplified as:

$$\vec{E}_s(\vec{r}) = ik\left(\overline{\overline{I}} - \hat{R}\hat{R}\right) \cdot \int\int_{s'} \left[ Z_0\vec{J}_s(\vec{r}') \right] \frac{e^{ik_0R}}{4\pi R} ds'$$

If the radar is in the far field of the polygon area s', large element PO can be applied. The surface currents can then be rewritten as:

$$\vec{J}_s(\vec{r}') = \vec{J}_{sm} e^{i\vec{k}_i \cdot (\vec{r}' - \vec{r}_0)},$$

$$\vec{M}_s(\vec{r}') = \vec{M}_{sm} e^{i\vec{k}_i \cdot (\vec{r}' - \vec{r}_0)}.$$

where $\vec{k}_0$ denotes the position of transmitter. The scattered fields then become:

$$\vec{E}_s = \frac{ik_0 e^{i(\vec{k}_s - \vec{k}_i)\cdot\vec{r}}}{4\pi R} \left(\overline{\overline{I}} - \hat{k}_s\hat{k}_s\right)\left[Z_0\vec{J}_{sm} - \hat{k}_{sn} \times \vec{M}_{sm}\right] \int\int e^{i(\vec{k}_i - \vec{k}_s)\cdot\vec{r}'} ds' =$$

$$\frac{k_0 e^{i(\vec{k}_s - \vec{k}_i)\cdot(\vec{r} - \vec{O}')}}{4\pi R k_\alpha} \left(\overline{\overline{I}} - \hat{k}_s\hat{k}_s\right)\left[Z_0\vec{J}_{sm} - \hat{k}_{sn} \times \vec{M}_{sm}\right]$$

-continued $$\sum_1^l \vec{e}_i \cdot \hat{t} \frac{e^{jk_\alpha(\vec{v}_i + \vec{v}_{i+1}) \cdot \hat{\alpha}/2} \sin\left(\frac{1}{2} k_\alpha \vec{e}_i \cdot \hat{\alpha}\right)}{\frac{1}{2} k_\alpha \vec{e}_i \cdot \hat{\alpha}},$$

where $\vec{k} = \vec{k}_i - \vec{k}_s = \vec{k}_n + \vec{k}_\alpha$, $\vec{k}_n$ is the component in the $\hat{n}$ direction, $\vec{k}_n = (\vec{k} \cdot \hat{n})\hat{n}$, and $\vec{k}_\alpha$ is the component on the surface of the facet, $\vec{k}_\alpha = k_\alpha \hat{\alpha}$. 1 denotes the number of edges for the polygon. $\hat{t}$ is a tangential unit vector on the surface perpendicular to $\vec{k}$. $\vec{k}_i$ denotes the edge vector of the polygon:

$$\vec{e}_i = \vec{v}_{i+1} - \vec{v}_i. \quad (i = 1, 2, 3, \dots, l\vec{v}_{l+1} = \vec{v}_1)$$

In various implementations, the Doppler frequency shift and/or the micro-Doppler frequency shift may be related the relative radial velocity of the hitting point on the object. In various implementations, objects that include a micro-Doppler effect may have different velocities for different points on the object. Accordingly, the facet velocity may be used as a parameter to calculate the Doppler frequency shift and/or the micro-Doppler-shift. For objects that do not include the micro-Doppler effect, the group velocity of the object may be used as a parameter to calculate the Doppler frequency shift.

At 816, control determines if the hit object is a human. If non, control selects the target velocity of the object to use as the hit velocity at 820, and then control proceeds to 828. If at 816 the hit object is a human, control selects the facet velocity as the hit velocity at 824, and then proceeds to 828. At 828, control calculates the Doppler frequency shift and/or the micro-Doppler frequency shift based on the path of the ray (for example, along one of the propagation paths 204-1 or 204-2). Additional details of calculating the Doppler frequency shift and/or micro-Doppler frequency shift will be described further with reference to FIG. 10.

Example CAD Model and Motion File

FIG. 9A is a graphical representation of an example CAD model 904 of an object according to the principles of the present disclosure. In this illustration, an example CAD model of the human object 220a is presented. The human object 220a is defined by a set of vertices 912 and a set of bones 916. In various implementations, the vertices 912 are connected via the bones 916.

FIG. 9B is a graphical representation of an example motion file 920 associated with the human object 220a. The motion file 920 is associated with a walking motion of the object. Accordingly, the bones 916 of the human object 220a are moved via the motion file 920 to simulate the walking motion of the human object 220a.

Example Doppler Frequency Shift

FIG. 10 is a graphical representation of an example Doppler frequency shift and/or a micro-Doppler frequency shift accumulation along a path (for example, one of the propagation paths 204-1 or 204-2) of a ray according to the principles of the present disclosure. In various implementations, the Doppler frequency shift and/or the micro-Doppler frequency shift may follow a chain rule based on the path of ray. The Doppler frequency shift and/or the micro-Doppler frequency shift may be represented by:

$$\Delta f_{0\to 1\to\dots\to n\to 0} = \left[\vec{v}_0 \cdot \left(-\hat{R}_1\right) + \vec{v}_1 \cdot \left(\hat{R}_1 - \hat{R}_2\right) + \right.$$
$$\left. \vec{v}_2 \cdot \left(\hat{R}_2 - \hat{R}_3\right) + \dots + (\vec{v}_n) \cdot \left(\hat{R}_n - \hat{R}_{n+1}\right) + \vec{v}_0 \cdot \hat{R}_{n+1}\right]\frac{f_0}{c}$$

Example Outputs

FIGS. 11A-11X are graphical representations of example outputs generated by the output generation module 332 according to the principles of the present disclosure. In various implementations, the outputs may include dynamic clustered electromagnetic rays. In some examples, the rays may vary for different time frames. At each frame, each ray may contain a unique time of flight, Doppler frequency shift, detection of arrival, direction of departure, and/or complex electromagnetic scattering response, among others. The electromagnetic scattering response may be related to the radar cross section of the surface of a target illuminated by a ray. In various implementations, an output may represent the relative radial speed (m/s) of each ray with respect to the radar. The relative speed may be proportional to the Doppler frequency shift for a respective ray.

With reference to FIGS. 11A-11C, outputs 1104A-1104C (for example, motion simulations) associated with the object (for example, human object 220a) walking is shown. The outputs include a simulation of the main motion (for example, movement of the torso of the object) and the secondary motions (for example, movement of the head, arms, hands, legs, and feet of the object) to simulate the walking motion of the object. The outputs may include radar cross section (RCS) data and may include units in decibels per square meter (dBsm).

Referring now to FIGS. 11D-11F, outputs 1108A-1108C (for example, motion simulations) associated with the object (for example, human object 220a) running is shown. The outputs include a simulation of the main motion (for example, movement of the torso of the object) and the secondary motions (for example, movement of the head, arms, hands, legs, and feet of the object) to simulate the running motion of the object. The outputs may include radar cross section (RCS) data and may include units in decibels per square meter (dBsm).

With reference to FIGS. 11G-11I, outputs 1112A-1112C (for example, motion simulations) associated with the object (for example, human object 220a) dancing is shown. The outputs include a simulation of the main motion (for example, movement of the torso of the object) and the secondary motions (for example, movement of the head, arms, hands, legs, and feet of the object) to simulate the dancing motion of the object. The outputs may include radar cross section (RCS) data and may include units in decibels per square meter (dBsm).

Referring now to FIGS. 11J-11L, outputs 1116A-1116C (for example, motion simulations) associated with the object (for example, human object 220a) jumping is shown. The outputs include a simulation of the main motion (for example, movement of the torso of the object) and the secondary motions (for example, movement of the head, arms, hands, legs, and feet of the object) to simulate the jumping motion of the object. The outputs may include radar cross section (RCS) data and may include units in decibels per square meter (dBsm).

With reference to FIGS. 11M-11O, outputs 1120A-1120C (for example, motion simulations) associated with the object (for example, human object 220a) walking is shown. The outputs include a simulation of the main motion (for example, movement of the torso of the object) and the secondary motions (for example, movement of the head, arms, hands, legs, and feet of the object) to simulate the walking motion of the object. The outputs may include Doppler range rate results.

Referring now to FIGS. 11P-11R, outputs 1124A-1124C (for example, motion simulations) associated with the object (for example, human object 220a) running is shown. The outputs include a simulation of the main motion (for example, movement of the torso of the object) and the secondary motions (for example, movement of the head, arms, hands, legs, and feet of the object) to simulate the running motion of the object. The outputs may include Doppler range rate results.

With reference to FIGS. 11S-11U, outputs 1128A-1128C (for example, motion simulations) associated with the object (for example, human object 220a) dancing is shown. The outputs include a simulation of the main motion (for example, movement of the torso of the object) and the secondary motions (for example, movement of the head, arms, hands, legs, and feet of the object) to simulate the dancing motion of the object. The outputs may include Doppler range rate results.

Figure 11W:
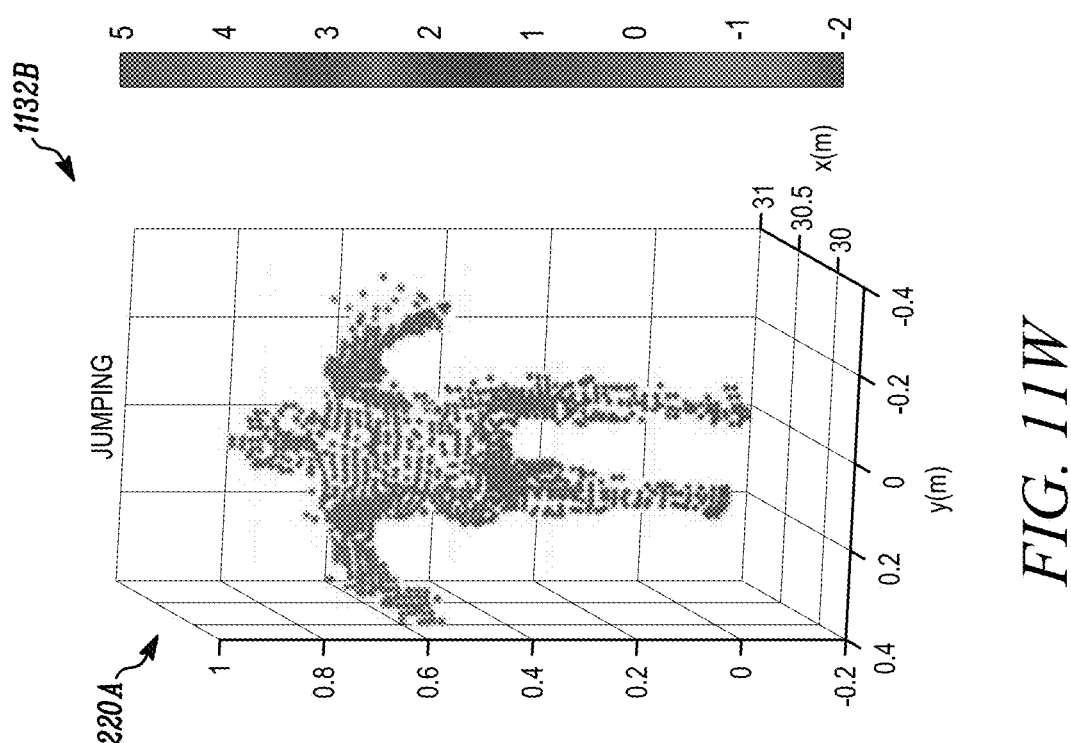

Referring now to FIGS. 11V-11X, outputs 1132A-1132C (for example, motion simulations) associated with the object (for example, human object 220a) jumping is shown. The outputs include a simulation of the main motion (for example, movement of the torso of the object) and the secondary motions (for example, movement of the head, arms, hands, legs, and feet of the object) to simulate the jumping motion of the object. The outputs may include Doppler range rate results.

FIGS. 12A and 12B are graphical representations of example simulated radar outputs generated by the output generation module 332 according to the principles of the present disclosure. The example outputs may include compressed data cube (CDC) data and a step-frequency waveform may be used in the radar model. In some examples, the CDC data may represent radar detections in a range-Doppler domain after signal processing. The example outputs are associated with an object (for example, a human) and the radar moving at the same speed (for example, 1.2 m/s), and the radar looking from the back of the object. With reference to FIG. 12A, an output 1204 without micro-Doppler effect is shown. With reference to FIG. 12B, an output 1208 with micro-Doppler effect is shown.

FIGS. 13A and 13B are graphical representations of example simulated radar outputs generated by the output generation module 332 according to the principles of the present disclosure. The example outputs may include compressed data cube (CDC) data and conventional waveform results (for example, Doppler bins=0.1394 m/s and Range bins=0.5762 m). The example outputs are associated with an object (for example, a human) moving at an average rate of speed (for example, 1.2 m/s). With reference to FIG. 13A, an output 1204 without micro-Doppler effect is shown. With reference to FIG. 13B, an output 1208 with micro-Doppler effect is shown.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship encompasses a direct relationship where no other intervening elements are present between the first and second elements as well as an indirect relationship where one or more intervening elements are present between the first and second elements.

The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD) or magnetic hard disk drive (HDD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module. The term memory hardware is a subset of the term computer-readable medium.

The apparatuses and methods described in this application may be partially or fully implemented by a special-purpose computer created by configuring a general-purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special-purpose computer, device drivers that interact with particular devices of the special-purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A computer-implemented method comprising:
receiving environment description data associated with a simulated environment including an object;
identifying an object type of the object;
in response to the object type being a human object type:
identifying a motion type associated with the object;
loading a CAD model associated with the object;
loading a motion file associated with the motion type; and
mapping the CAD model to the motion file;
performing ray tracing simulation including:
launching a set of rays from a ray source towards the object; and
determining a set of propagation paths of the set of rays from the ray source to the object and a set of reflection paths of the set of rays from the object to a ray receiver;
performing physical optics simulation to determine a set of scattered fields associated with the set of reflection paths of the set of rays;
determining a set of micro-motions of the object based on calculating at least one of a Doppler shift and a micro-Doppler shift for each ray of the set of rays;
performing ray clustering including combining rays of the set of rays that include one or more similar characteristics; and
transforming a simulation output for display on a user device; wherein:
the simulation output is based on the ray tracing simulation and the physical optics simulation,
the simulation output indicates the motion type of the object, and
the motion type of the object includes a main motion of the object and the set of micro-motions of the object.

2. The computer-implemented method of claim 1 wherein the object type is at least one of a human object type, a building object type, a vehicle object type, an animal object type, and a tree object type.

3. The computer-implemented method of claim 1 wherein:
the motion type is associated with a physical activity of the object; and
the physical activity is associated with one of walking, running, dancing, jumping, and riding a bicycle.

4. The computer-implemented method of claim 1 wherein:
loading the CAD model associated with the object includes selecting the CAD model from a CAD model database; and
loading the motion file associated with the motion type includes selecting the motion file from a motion file database.

5. The computer-implemented method of claim 1 wherein identifying the motion type associated with the object includes:
determining a speed of the object;
in response to the speed being greater than a determined threshold, selecting a running motion type as the motion type; and
in response to the speed being less than the determined threshold, selecting a walking motion type as the motion type.

6. The computer-implemented method of claim 1 further comprising:
modifying a mesh of the object;
calculating a speed of each facet of the object;
generating an acceleration data structure; and
copying the acceleration data structure to a graphics processing unit in connection with performing the ray tracing simulation.

7. The computer-implemented method of claim 1 wherein:
the ray source and the ray receiver are associated with a reference point; and
the reference point is based on a radar system of a vehicle.

8. The computer-implemented method of claim 1 wherein mapping the CAD model to the motion file includes:
linking vertices of a mesh of the object to a first set of bones of the CAD model;
mapping a second set of bones of the motion file to the first set of bones;
initializing a transforming matrix; and
identifying a period of one in cycle in time and distance of the motion file.

9. The computer-implemented method of claim 1 further comprising, in response to the ray receiver receiving a ray of the set of rays that hit the object, querying an object tree data structure to identify the object type of the object.

10. The computer-implemented method of claim 1 wherein:
in response to the object type being the human object type, the ray tracing simulation is performed in connection with a global coordinate system; and
in response to the object type not being the human object type, the ray tracing simulation is performed in connection with a local coordinate system.

11. A computer system comprising:
memory hardware configured to store instructions; and
processor hardware configured to execute the instructions, wherein the instructions include:
receiving environment description data associated with a simulated environment including an object;
identifying an object type of the object;
in response to the object type being a human object type:
identifying a motion type associated with the object;
loading a CAD model associated with the object;
loading a motion file associated with the motion type; and
mapping the CAD model to the motion file;
performing ray tracing simulation including:
launching a set of rays from a ray source towards the object; and
determining a set of propagation paths of the set of rays from the ray source to the object and a set of reflection paths of the set of rays from the object to a ray receiver;
performing physical optics simulation to determine a set of scattered fields associated with the set of reflection paths of the set of rays;
determining a set of micro-motions of the object based on calculating at least one of a Doppler shift and a micro-Doppler shift for each ray of the set of rays;
performing ray clustering including combining rays of the set of rays that include one or more similar characteristics; and transforming a simulation output for display on a user device; wherein:
the simulation output is based on the ray tracing simulation and the physical optics simulation,
the simulation output indicates the motion type of the object, and
the motion type of the object includes a main motion of the object and a set of micro-motions of the object.

12. The computer system of claim 11 wherein the object type is at least one of a human object type, a building object type, a vehicle object type, an animal object type, and a tree object type.

13. The computer system of claim 11 wherein:
the motion type is associated with a physical activity of the object; and
the physical activity is associated with one of walking, running, dancing, jumping, and riding a bicycle.

14. The computer system of claim 11 wherein:
loading the CAD model associated with the object includes selecting the CAD model from a CAD model database; and
loading the motion file associated with the motion type includes selecting the motion file from a motion file database.

15. The computer system of claim 11 wherein identifying the motion type associated with the object includes:
determining a speed of the object;
in response to the speed being greater than a determined threshold, selecting a running motion type as the motion type; and
in response to the speed being less than the determined threshold, selecting a walking motion type as the motion type.

16. The computer system of claim 11 wherein the instructions include:
modifying a mesh of the object;
calculating a speed of each facet of the object;
generating an acceleration data structure; and
copying the acceleration data structure to a graphics processing unit in connection with performing the ray tracing simulation.

17. The computer system of claim 11 wherein:
the ray source and the ray receiver are associated with a reference point; and
the reference point is based on a radar system of a vehicle.

18. The computer system of claim 11 wherein mapping the CAD model to the motion file includes:
linking vertices of a mesh of the object to a first set of bones of the CAD model;
mapping a second set of bones of the motion file to the first set of bones;
initializing a transforming matrix; and
identifying a period of one in cycle in time and distance of the motion file.

19. The computer system of claim 11 wherein the instructions include, in response to the ray receiver receiving a ray of the set of rays that hit the object, querying an object tree data structure to identify the object type of the object.

20. The computer system of claim 11 wherein:
in response to the object type being the human object type, the ray tracing simulation is performed in connection with a global coordinate system; and
in response to the object type not being the human object type, the ray tracing simulation is performed in connection with a local coordinate system.

* * * * *